United States Patent [19]
Redwing et al.

[11] Patent Number: 5,874,747
[45] Date of Patent: Feb. 23, 1999

[54] HIGH BRIGHTNESS ELECTROLUMINESCENT DEVICE EMITTING IN THE GREEN TO ULTRAVIOLET SPECTRUM AND METHOD OF MAKING THE SAME

[75] Inventors: Joan Redwing; Michael A. Tischler, both of Phoenix, Ariz.

[73] Assignee: Advanced Technology Materials, Inc., Danbury, Conn.

[21] Appl. No.: 894,609

[22] PCT Filed: Feb. 5, 1996

[86] PCT No.: PCT/US96/01724

§ 371 Date: Nov. 24, 1997

§ 102(e) Date: Nov. 24, 1997

[87] PCT Pub. No.: WO96/24167

PCT Pub. Date: Aug. 8, 1996

[51] Int. Cl.⁶ .......................... H01L 33/00; H01L 29/161
[52] U.S. Cl. ............................ 257/77; 257/84; 257/103; 257/461; 257/81; 438/107; 438/133; 438/68; 438/87
[58] Field of Search .................. 257/77, 94, 103, 257/461, 81, 85, 99; 438/107, 133, 68, 87

[56] References Cited

U.S. PATENT DOCUMENTS

| | | | |
|---|---|---|---|
| 3,922,703 | 11/1975 | Pankove | 357/17 |
| 4,862,471 | 8/1989 | Pankove | 372/45 |
| 4,918,497 | 4/1990 | Edmond | 357/17 |
| 4,985,742 | 1/1991 | Pankove | 357/34 |
| 5,210,051 | 5/1993 | Carter, Jr. | 437/107 |
| 5,247,533 | 9/1993 | Okazaki et al. | 372/45 |
| 5,387,804 | 2/1995 | Suzuki et al. | 257/85 |
| 5,393,993 | 2/1995 | Edmond et al. | 257/321 |
| 5,432,808 | 7/1995 | Hatano et al. | 257/341 |

OTHER PUBLICATIONS

Cree Research Inc. Product Sheet "Preliminary; Silicon Carbide Blue LED C470–D8".

"High Power GaN P–N Junction Blue–Light–Emitting Diodes," J–Appl. Phys. vol. 30, No. 12A, Dec. 1991, pp. L1998–L2001.

"High–power InGaN/GaN double–heterostructure violet light emitting diodes," Appl. Phys. Lett., vol. 62, No. 19, 10 May 1993, pp. 2390–2393.

"Stimulated Emission Near Ultraviolet at Room Temperature from a GaN Film Grown on Sapphire by MOVPE Using an A1N Buffer Layer," Jpn. J. of Applied Physics, vol. 29, No. 2, Feb. 1990, pp. L250–L206.

"Room–Temperature Low–Threshold Surface–Stimulated Emission by Optical Pumping from $Al_{0.1}Ga_{0.9}N/GaN$ Double Hetero–structure," Jpn. J. Appl. Phys. vol. 32 (1993) pp. L1000–L1002, Part 2, No. 7B, 15 Jul. 1993.

"Vertical–cavity, room temperature stimulated emission from photopumped GaN films deposited over sapphire substrates using low–pressure metalorganic chemical vapor deposition," Appl. Phys. Lett. 58(14), 8 Apr. 1991, pp. 1515–1517.

"Reflective filters based on single–crystal $GaN/Al_xGa_{1-x}N$ multilayers deposited using low–pressure metalorganic chemical vapor deposition," Appl. Phys. Lett. 51(12), 16 Sep. 1991, pp. 1449–1451.

(List continued on next page.)

*Primary Examiner*—Donald Monin
*Attorney, Agent, or Firm*—Steven J. Hultquist; Oliver A. M. Zitzmann

[57] ABSTRACT

A green-blue to ultraviolet light emitting semiconductor laser having a top contact, a Bragg reflector, cladding layer, active layer, cladding layer, buffer, substrate, bottom contact and a passivation layer. The key aspect is a Ga*N material on a base structure comprising a SiC substrate selected from a group consisting of 2H-SiC, 4H-SiC and a-axis oriented 6H-SiC. Furthermore, the cladding layers have larger band gaps than the active layer and are complimentarily doped.

32 Claims, 13 Drawing Sheets

OTHER PUBLICATIONS

"Defect reduction in GaAs epitaxial layers using a GaAsP–InGaAs strained layer super lattice," Appl. Phys. Lett. 46(3), Feb. 1, 1985, p. 294.

"High Power Silicon Carbide IMPATT Diode Development," AIAA SD10 Interceptor Technology Conf., Jun. 1993.

"Conductivity Anisotropy in Epitaxial 6H and 4HSiC," Cree Research Abstract, Schaffer et al.

"High–Luminosity Blue and Blue–Green Gallium Nitride Light–Emitting Diodes," Science, vol. 267, Jan. 6, 1995, pp. 51–55.

"GaN grown on hydrogen plasma cleaned 6H–SiC substrates," Appl. Phys. Lett., vol. 62, No. 7, Feb. 15,1993, pp. 702–704.

"A comparative study of GaN epilayers grown on sapphire and SiC substrates by plasma–assisted molecular–beam epitaxy," Appl. Phys. Lett., 62(26), Jun. 28, 1993, pp. 3479–3481.

"Deposition, characterization, and device development in diamond, silicon carbide, and gallium nitride thin films" J. Vac. Sci. Technol. A11 (4), Jul./Aug. 1993, pp. 829–837.

HIGH BRIGHTNESS ELECTROLUMINESCENT DEVICE EMITTING IN THE GREEN TO ULTRAVIOLET SPECTRUM AND METHOD OF MAKING THE SAME

DESCRIPTION

1. Field of the Invention

The present invention relates to a light emitting optical device capable of emitting light in the green-blue to ultraviolet spectrum, and more specifically semiconductor devices formed using gallium nitride, e.g., comprising a gallium nitride active layer on a silicon carbide substrate, as well as to a method for forming gallium nitride devices using silicon caribide substrates.

2. Description of the Related Art

UV and blue light emitters (both lasers and light emitting diodes (LEDs)) have a wide range of applications including high density optical storage, full color displays, color determination systems, and spectroscopic analysis sources. Electroluminescent semiconductor devices such as lasers and LEDs that emit light in the green-blue to ultraviolet region of the electromagnetic spectrum are correspondingly of great interest, but have not yet reached the levels of performance that are presently available in red and yellow light emitters, as measured by quantum efficiency and luminous intensity. The major reason for the deficiency of the blue light-emitting devices is the much less well developed state of the semiconductor materials that are suitable for blue light emission.

Only a few material systems are capable of directly producing solid state light emission in the blue/UV region of the electromagnetic spectrum—the II-VI compounds, silicon carbide, and the III-V nitrides.

Although the II-VI compounds such as ZnSe, ZnS, CdS, and their alloys are direct band gap materials and thus have high optical efficiency, such compounds are plagued by fuidametal material property deficiencies, including softness and low melting temperatures, which cause defects to be readily generated and propagated, in turn leading to poor reliability characteristics and short product life. Thus, while LEDs and lasers have been demonstrated in II-VI compounds, the lack of stability and the short lifetimes of the resulting devices are major shortcomings which have severely restricted their commercial potential and use. It has been demonstrated that the short lifetimes in II-VI devices result from the rapid propagation of defects throughout their active regions, which act as nonradiative recombination sites. These results are indicative of low temperature and room temperature characteristics. Operation at higher temperatures or at high power conditions will increase the degradation rate and exacerbate the problem. Additional problems with the II-VI materials include the necessity of using quaternary layers to achieve blue emission in relatively lattice-matched heterostructures. The simplest and most well developed materials are ZnSe, ZnS, CdS, and their alloys which produce emission in the blue-green region, about 500 nm. Other II-VI compounds could be used to produce emission in the blue and ultraviolet, for example alloys of ZnS and either ZnSe, CdS, CdSe or MnSe. However, these materials have not been well investigated and have other major problems including the lack of a simple latticematched heterostructure system and the lack of a suitable substrate.

Blue LEDs formed in silicon carbide epilayers on silicon carbide substrates have been reported (U.S. Pat. No. 4,918, 497). However, silicon carbide is an indirect band gap material, and therefore radiative recombination is inefficient, and consequently these SiC-based light emitting diodes (LEDs) have poor optical efficiency. A commercially available 6H-polytype SiC LED with a peak light emission at a wavelength of 470 nm has an external quantum efficiency of 0.02% and performance of 0.04 lumens/watt (Cree Research, Durham, N.C.). This performance is quite low compared to the best LEDs emitting in the red (AlGaAs, 16% quantum efficiency and 8 lumens/watt) and yellow-green (AlInGaP, 1% quantum efficiency and 6 lumens/watt), where quantum efficiency is defined as the number of photons emitted per electron supplied X 100%, and luminous intensity is the luminous (visible) flux output of a light source measured in lumens divided by the electrical power input to the device. Lumens are calculated by multiplying the radiant flux output of a device (in watts) by the human eye's sensitivity as defmed by the Commission Internationale de L'Eclairage (CIE), and so the luminous efficiency is related to the amount of light perceived by the human eye per power input.

The performance of SiC LEDs cannot be expected to match that of the III-V direct band gap materials. In addition, there is no convenient heterostructure system for SiC. A convenient heterostructure system is important because it increases device efficiency and permits selection of the emission wavelength.

The best choice for blue and UV light emitter applications appears to be the III-V nitrides, i.e. GaN, AlN, InN and their ternary and quaternary alloys such as AlGaN, InGaN, or AlInGaN. The III-V nitrides meet many of the requirements for making light emitting devices. These materials possess direct band gaps, a convenient, well lattice-matched heterostructure system, the ability to choose the output wavelength by varying the composition and structure, and good thermal stability. The III-V nitrides exhibit strong luminescence in the ultraviolet and blue.

Gallium nitride (note: as used herein, the term "gallium nitride" is intended to be broadly construed, to encompass gallium nitride per se, as well as gallium nitride alloys compounds, e.g., aluminum, and indium) is a most particularly attractive semiconductor material for electroluminescent or light emitting devices because its wide band gap provides for light emission in the green-blue to ultraviolet wavelength regime. Such light emitting devices require the preparation of gallium nitride layers of high crystalline quality, free of quenching defects. An obstacle to such devices has been the lack of a suitable substrate on which to grow good gallium nitride layers. The III-V nitrides and their alloys are referred to herein as Ga*N materials. As used herein, the term Ga*N refers to binary (e.g. GaN), ternary (MaN), and quaternary (MM'GaN) type gallium nitride compounds, including, by way of example, such compounds as AlN, InN, AlGaN, InGaN, INAlN, and AlInGaN, wherein M is a metal which is compatible with Ga and N in the composition MGaN and the composition MGaN is stable at standard temperature and pressure (25° C. and one atmosphere pressure) conditions, and wherein M' is a compatible metal providing quaternary compounds of the formula $M_{1-x-y}M'yGa_xN$, wherein x and y range from 0 to 1. It will be further understood that ternary and quaternary compounds may be referred to by general formula without subscripts, e.g., AlGaInN, wherein the stoichiometric coefficients (for aluminum, gallium, and indium, in this instance) have been deleted for general reference purposes, it being understood that such alloy compositions entail stoichiometry relative to the metal components which provides a stable composition at the aforementioned standard temperature and pressure conditions.

Recent improvements in growth and p-type doping have led to several demonstrations of high efficiency, GaN-based blue LEDs. GaN LEDs grown on (0001) oriented sapphire have exhibited an external quantum efficiency of 0.18%, almost 10 times that of SiC LEDs (S. Nakamura et al., Jpn. J. of Appl. Phys. 30 (1991) L1998). More recently, AlGaN/GaN heterostructure LEDs with outputs of 1000 mcd at 20 mA (Nikkei Electronics Dec. 20, 1993 (No. 597)) have been reported. By comparison, SiC LEDs emit only about 25 mcd at 20 mA. Additionally, stimulated emission by photopumping has been demonstrated in GaN (H. Amano et al., Jap. J. Appl. Phys. 29 (1990) L205); M. A. Khan et al., Appl. Phys. Lett. 58 (1991) 1515). Finally, the III-V nitrides possess many similarities to the III-V arsenides GaAs and AlAs, and so growth and fabrication techniques that have been well developed for the latter materials may be employed in fabricating nitride-based devices as well.

The band gap of GaN is 3.4 eV while that of AlN is 6.2 eV and InN is 2.09 eV. Thus a device with a GaN active layer would emit at about 365 nm for band to band recombination. Like GaAs/AlAs, GaN/AlN form a closely lattice-matched heterostructure system. The difference in the lattice constants of GaN and AlN is about 2.5%. While larger than the difference between the lattice constants of GaAs and AlAs, this fairly close match does permit the use of GaN/AlGaN alloys with mismatches of less than 0.5%. Such a convenient heterostructure system is important for light emitting devices because it increases device efficiency and permits selection of the emission wavelength. The wavelength can be modified in several ways. The first is through the use of quantum well heterostructures, in which the emission energy increases as the well width decreases, because of quantum size effects. The second is the use of AlGaN alloys in the active region, which also increases the emission energy relative to GaN. Of course, these two techniques could be combined, if desired. The emission energy can be reduced by the addition of In to the active region alloy.

A key problem with the present GaN light emitting devices is that they are primarily fabricated on (0001) oriented sapphire ($Al_2O_3$) substrates. Use of sapphire has a number of problems. The first is that the lattice mismatch between GaN and sapphire is about 13.8%, which is quite large. This large lattice mismatch causes a high density of defects at the sapphire/GaN interface, in the range of $10^8$ to $10^{10}$ per $cm^2$, and these defects propagate up into the device's active region during growth of the active layer. Defects pose a serious problem to the reliable operation of optical emitter devices such as lasers and LEDs. Often optical devices have dark line defects which multiply during operation. This phenomenon is an especially important problem for emitters grown on lattice mismatched substrates or containing layers that are mismatched. With continued operation, the density of these dark line defects increases until the light output is reduced to an unacceptable level and device failure occurs. Therefore, the device performance of GaN/sapphire light emitters is limited by crystal quality effects.

Another problem with GaN light emitting devices fabricated on sapphire substrates is that sapphire is insulating, which means that the standard, simple LED or laser structures, with one contact on top and the other on the bottom, cannot be used. Additional fabrication steps must be used to make both contacts on the tops of the devices. Additionally, specialized wirebonding and packaging must be employed to accommodate the non-standard arrangement of the two top contacts. An important side effect of having to place both contacts on top of the device when a sapphire substrate is used is that the die or chip area must be about twice as large as the standard structure to leave room for both contacts on the top surface. This effectively halves the number of devices which can be made on a given substrate area, resulting in increased cost per device.

It would therefore be advantageous to employ substrates other than sapphire for III-V nitride devices.

Silicon carbide has several advantages as a substrate material for III-V nitride based light emitting devices. The first is that it provides a much closer lattice match to the III-V nitrides than does sapphire (3.4% vs. 13.8% for sapphire and GaN), leading to devices with fewer defects and thus higher efficiencies and longer lifetimes. The second is that SiC can be made conductive, which permits the use of simple and conventional LED and laser structures, with one contact on top and the other on the bottom. Less processing is required thereby, the conventional packages and packaging tools can be used, and the device requires about one-half the area of an equivalent device made on a sapphire substrate. Finally, most polytypes of silicon carbide show high light transmittance throughout the visible light wavelengths and some show good transmittance even into the ultraviolet region. GaN light emitting diodes that could be fabricated on bulk single crystal, single polytype SiC substrates, in particular (0001) oriented 6H-SiC or cubic 3C-SiC, have been proposed (U.S. Pat. No. 5,210,051). These combinations of materials could show significant advantages over the GaN/sapphire system. The hexagonal 2H-GaN/(0001)-oriented 6H-SiC system was selected because of the availability of the 6H-SiC substrate and the compatibility of the crystal structures. The cubic GaN/3C-SiC system was proposed likewise on the basis of crystal compatibility arguments, although bulk 3C-SiC substrates are not currently available and little is known of the preparation or properties of cubic GaN. The optimization of electrical and optical properties, in particular charge carrier mobilities and percent transmittance of light, have not been addressed, nor has the use of a heterostructure system, important because it increases device efficiency and permits selection of the emission wavelength. Methods to economically fabricate large quantities of GaN LEDs on SiC substrates have not been described. Device structures designed to increase the output of light emitted are needed. These issues are crucial to the economical production of high brightness, commercially viable blue light emitting devices. Further, the lattice constants and thermal expansion coefficients of GaN and SiC are sufficiently different that compatibility problems occur under the conditions of layer growth and subsequent processing.

Differences in the lattice constants and thermal expansion coefficients of GaN and SiC often cause cracking in GaN layers grown on SiC substrates when the samples are cooled from the growth temperature (~1000° C.) to room temperature. Cracking of the GaN epi-layers is a severe problem for the fabrication of electronic and optical devices from these materials. Consequently, it is very desirable to have a method to grow GaN layers on SiC that are free of cracks and have very good structural, optical and electrical properties.

The quality of GaN grown on lattice mismatched substrates such as sapphire, Si, GaAs and SiC is greatly improved when a buffer or transition layer is grown on the substrate prior to growth of the GaN layer.

Several different types of buffer layers have been used for growth of GaN on sapphire including AlN (I. Akasaki, H.

Amano, Y. Koide, K. Hiramatsu and N. Sawaki, Effects of AlN Buffer Layer on Crystallographic Structure and Electrical and Optical Properties of GaN and $Al_xGa_{1-x}N$ ($0<x<0.4$) Films Grown on Sapphire Substrate by MOVPE, J. Crystal Growth 98 (1989) 209) and $Al_xGa_{1-x}N$ where $0<x<1$ (S. Nakamura, Crystal Growth Method for Gallium Nitride-Based Compound Semiconductor, U.S. Pat. No. 5,290,393.). These buffers are typically very thin (less than 0.5 $\mu$m thick, preferably less than 0.1 $\mu$m thick) and are grown at low temperature (900° C. or lower). The buffers grown at low temperature are polycrystalline and have a high density of defects. The purpose of the polycrystalline buffer is to accommodate the very large lattice mismatch between sapphire and GaN (13.4%). AlN buffer layers have also been used for growth on Si substrates (T. Takeuchi, H. Amano, I. Akasaki, A. Watanabe, and K. Manabe, Method of Fabricating a Gallium Nitride-Based Semiconductor Device with an Aluminum and Nitrigen Containing Intermediate Layer, U.S. Pat. No. 5,389,571).

SiC has a much closer lattice match to GaN (3.4%) than does sapphire. While an AlN layer grown at low temperature has been used as a buffer for growth of GaN on SiC, improved crystal properties have been obtained by growing a thin, approximately 1000 Å AlN buffer at temperatures greater than 1000° C. (T. W. Weeks, M. D. Bremser, K. S. Ailey, E. Carlson, W. G. Perry and R. F. Davis, GaN Thin Films Deposited via Organometallic Vapor Phase Epitaxy on 6H-SiC (0001) using High-Temperature Monocrystalline AlN Buffer Layers, Appl. Phys. Lett. 67 (1995) 401.) We have found that improved GaN structural properties, as determined by x-ray double crystal rocking curve measurements, can be obtained by using a high temperature AlN buffer. The full-width-at-half-maximum (FWHM) for the (0004) GaN reflection is 270 arc-sec with an AlN buffer grown at 1100° C. on 6H-SiC. compared to 428 arc-secs when AlN grown at 550° C. is used as a buffer on 6H-SiC. GaN grown on SiC substrates using AlN buffers, however, contains parallel cracks that extend across the entire GaN layer. This is due to strain in the GaN layer that is caused by the large lattice mismatch between GaN and AlN (2.4%) and AlN and SiC (1.0%). A transition buffer layer has been used to decrease the extent of GaN film cracking when growing on SiC (J. A. Edmond, V. Dmitriev, K. Irvine, Buffer Structure Between Silicon Carbide and Gallium Nitride and Resulting Semiconductor Devices", U.S. Pat. No. 5,393, 993). This transition buffer contains 3 layers which are described as a top (Al,Ga)N layer (%Al>%Ga) an intermediate (Al,Ga)N layer (%Ga>%Al) and a bottom AlN layer. There is still, however, a large lattice mismatch between the GaN layer and the top (Al,Ga)N layer of the buffer (>1.4%) in this structure which introduces strain into the GaN layer.

In respect of the teachings of U.S. Pat. No. 5,393,993, it is to be noted that growth of GaN on SiC requires the use of specific buffer structures to achieve high quality material. These typically involve some graded composition alloys which further complicate that band structure. For example, in U.S. Pat. No. 5,393,993 a buffer layer is disclosed that actually creates a potential barrier to current flow between the SiC substrate and the GaN layer. In this structure, the (Al,Ga)N layer next to the device structure has a higher Al composition than the (Al,Ga)N layer below it.

These potential barriers lead to increased series resistance and reduced device efficiency. Even if the layers are all doped, there will still be the potential barriers which will cause increased series resistance. This is made clear in the LED structures disclosed in U.S. Patent No. 5,393,993. To get around these problems shorting straps need to be added across the buffer layer. This greatly complicates the fabrication process and results in increased costs. While applicable for LEDs, with low current densities, this solution is unsuitable for high current density devices such as lasers and high power electronic devices.

Another problem when growing GaN on foreign substrates is that the growth conditions need to be very carefully controlled during the intial nucleation stages to achieve high quality material. Typically thin buffer layers (about 200 Å) are grown at low temperature (about 500° C.) prior to the growth of the GaN device structure. The thickness, growth rate and growth temperature must be controlled to very tight tolerances to achieve good material.

The buffer layer described hereinafter addresses both of these problems. In the first place, these can be grown at the GaN growth temperature, thus eliminating the need for control at two temperatures in the growth process, as well as provide tight control over the thickness of the low temperature buffer layer used in conventional processes.

The conductive graded buffer starts with a low Al composition and grades down to GaN. Thus the bandgap discontinuity is much less, resulting in a much lower barrier to current flow, and thus a lower series resistance and higher device efficiency. In the disclosed buffer layer there is a much smaller barrier to current flow and no potential wells to trap carriers. These improvements result in lower series resistance and higher device efficiency in devices where the substrate comprises one contact to the device.

It is therefore an object of the present invention to provide bright green-blue to ultraviolet light emitting devices with high optical efficiency, long lifetime, and a simple fabrication process which is compatible with current device fabrication, testing and packaging processes. The invention provides improved charge carrier mobilities and light transmittance. Various objectives of the invention include providing: a method for making these bright blue light emitting devices; a method for selection of the output wavelength of the light emitting device by control of the composition and structure of the active region of the device; a device structure that enhances the efficiency of light extraction from the light emitting device by means of Bragg mirrors that reflect light of the wavelength emitted by the device; an alternative method for device fabrication, to keep damage from the dicing operation, which may degrade the device characteristics, away from the active region and thereby avoid the necessity of post-dicing etching steps; methods for reducing the misfit dislocation density at the interface between the substrate and the active layer. Another object of the present invention is to provide composite structures comprising buffer layers between high-quality, crack-free layers of gallium nitride on lattice-mismatched substrates, especially silicon carbide, and a method for preparing such composite structures.

SUMMARY OF THE INVENTION

In one aspect, the present invention relates to a bright green-blue-to-ultraviolet light emitting optical device, e.g. a green-blue to ultraviolet emitting laser or a green-blue to ultraviolet emitting diode, comprising a Ga*N active layer and a silicon carbide substrate of an anisotropic polytype such as hexagonal or rhombohedral, preferably oriented such that growth of the Ga*N layers takes place on or slightly off-axis on an a-axis or c-axis oriented substrate. The SiC substrate preferably consists of 2H-SiC, 4H-SiC, or a-axis oriented 6H-SiC.

In another aspect, the invention may incorporate a structural modification to increase the light o utput comprising a dielectric Bragg mirror beneath the LED structure, made of alternating layers of AlN, GaN, InN or their alloys.

In yet another aspect, the device may be defined during device fabrication by a process comprising mesa etching, optional passivation of the mesa edge, and contact formation, to produce a device in which the critical p-n junction edge region is physically separated from the dicing region.

Another aspect of the invention relates to a semiconductor device or precursor thereof. comprising a layer of single crystal silicon carbide and a layer of single crystal gallium nitride, having a buffer layer therebetween comprising a compositionally graded Ga*N layer.

Such compositionally graded Ga*N layer may for example comprise a compositionally graded $Al_xGa_{1-x}N$ buffer layer between the gallium nitride and silicon carbide layers, wherein x can range from 0 to 1, and the buffer layer is compositionally graded from an interface of the the buffer layer with the silicon carbide layer at which x is 0, to an interface of the buffer layer with the gallium nitride layer at which x is 1.

A still further aspect of the invention relates to aspect of the invention relates to a semiconductor device or precursor thereof, comprising a silicon carbide substrate and an epitaxial layer of gallium nitride, having a buffer layer therebetween comprising a compositionally graded (Al,Ga)N buffer layer. A preferred silicon carbide substrate comprises 6H-SiC, with an $Al_xGa_{1-x}N$ buffer layer where the Al composition (x) is graded from 1 at the buffer-SiC interface to 0 at the GaN-buffer interface. The thickness of such graded buffer can range from 200 Å up to 5 $\mu$m, with a preferred range being from 500 Å up to 1 $\mu$m.

A variation of the above-described structure may comprise a thin AlN buffer layer which is initially grown on SiC followed by the compositionally graded (Al, Ga)N buffer and the GaN epitaxial layer. The thickness of the AlN buffer layer can range from 50 Å up to 5 $\mu$m, with a preferred range being from 100 Å up to 1 $\mu$m.

Another aspect of the invention relates to aspect of the invention relates to a semiconductor device or precursor thereof, comprising a conductive buffer layer of the formula $Al_xGa_{1-x}N$ wherein the buffer layer includes a lower Al composition layer that is doped to render it highly conductive in character, such that x is in the range of from x=1 to x=0.3, preferably with x being between 0.7 to 0.2. The corresponding end composition could be GaN or a lower $Al_yGa_{1-y}N$ composition, where y<x. The use of the composition $Al_yGa_{1-y}N$ instead of GaN as the final composition in the grade may be particularly useful when the epitaxial layer to be grown on the buffer is (Al, Ga)N instead of GaN.

The conductive buffer layer may be made conductive by doping with any suitable dopant species, so that the layer is of the desired n-type or p-type, e.g., silicon or magnesium, respectively.

The Ga*N buffer layers described hereinabove may be made of (Al, Ga)N compositionally graded layer, (Al, In)N compositionally graded layer or (Al, Ga, In)N compositionally graded layers.

If an epitaxial layer to be grown on the buffer contains In, the compositionally graded buffer layer may be continued to the (In, Ga)N, (In, Ga)N, or (Al, Ga, In)N composition of the epitaxial layer. For example, if the epitaxial layer is $In_{0.1}Ga_{0.9}N$, then the buffer structure may illustratively begin with AlN and grade through (Al, Ga)N to GaN, and then continue grading from GaN to $In_{0.1}Ga_{0.9}N$.

Another aspect of the invention relates to a semiconductor device or precursor thereof, comprising a SiC substrate element including a mesa-shaped portion having a Ga*N quantum well structure or other Ga*N structure formed thereon, wherein the mesa-shaped portion has an equivalent diameter in the range of from 50 to 300 $\mu$m, and a height of from 1 to 15 $\mu$m The SiC substrate may comprise 2H-SiC, 4H-SiC, or a-axis oriented 6H-SiC. The quantum well structure may have a well width of from 150 Å to 750 Å.

Other aspects, features and embodiments of the invention will be more fully apparent from the ensuing disclosure and appended claims.

DETAILED DESCRIPTION OF THE INVENTION, AND PREFERRED EMBODIMENTS THEREOF

The present invention is based on the discovery that by using silicon carbide of a selected polytype and growing Ga*N on that substrate in selected orientations, light emitting devices, e.g. a green-blue to ultraviolet emitting laser or a green-blue to ultraviolet emitting diode, of surprisingly high quantum efficiency and luminous efficiency may be fabricated. The luminescence efficiency, charge carrier mobilities and transmittance of light are improved.

The substrate polytype and orientation are selected to optimize the performance of the light emitters. The properties that figure most strongly in this selection are crystal structure, charge carrier mobilities, and transparency of the substrate to light of the wavelengths desirably emitted by the light emitters.

SiC has over 200 polytypes, a situation that is a consequence of a one-dimensional variation in the stacking sequence of the Si-C layers. The polytype with the largest band gap is the 2H hexagonal form, with a band gap of 3.3 eV, which corresponds to a band-to-band emission wavelength of 380 nm. While the ensuing discussion is primarily directed to the 2H-SiC, 4H-SiC and 6H-SiC polytypes, it will be recognized that a wide variety of SiC polytypes may be utilized in the broad practice of the present invention. Generally preferred polytype species will have more isotropic crystal structures, high carrier mobilities, and low anisotropy of mobility.

GaN grows in hexagonal (2H) and cubic polytypes. The hexagonal polytypes grow on hexagonal SiC polytypes, and cubic GaN grows on 3C-SiC. High crystal quality hexagonal GaN epilayers can be obtained on 2H-, 4H- and 6H-SiC substrates.

In silicon carbide, the mobility of the charge carriers varies with the polytype. To maximize device performance, specific orientations and polytypes of SiC are selected to achieve a very high useful mobility. The mobility of 4H-SiC is about twice that of 6H-SiC, and that of 2H is even higher yet. Thus the use of 4H-SiC or 2H-SiC substrates immediately provides an advantage when a highly conductive substrate is desired, as it is for LED and laser devices. Conductivity s behaves as s=q $\mu$n where q is the electronic charge, $\mu$ is the carrier mobility and n is the carrier concentration. Because the mobility is twice as high in 4H-SiC compared to 6H-SiC, the conductivity can be made twice as high.

Figure 1:
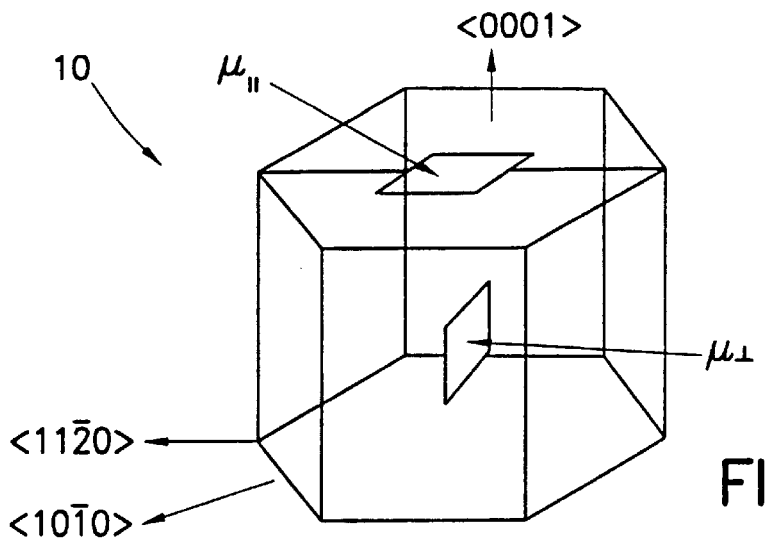
FIG. 1 shows a schematic representation of a hexagonal silicon carbide crystal with the vertical arrow indicating the (0001) direction; the "a-axis" directions are denoted by the horizontal arrows, and the c-axis direction by the vertical arrow.

Another method to achieve high useful mobility is to ensure that the crystal's high mobility axis is aligned with the current flow direction. FIG. 1 shows a schematic of hexagonal SiC crystal 10 showing the crystallographic directions and sample orientations for measuring carrier mobility parallel to ($\mu//$) and perpendicular ($\mu\bot$) to the (0001) face. The mobilities in 6H-SiC measured in the (0001), $10\bar{1}0$ and $11\bar{2}0$ directions are given in Table I below:

TABLE I

| Carrier Concentration | Orientation | Mobility |
|---|---|---|
| 2 × 10$^{18}$ | 1010 ("a-axis") | 104 |
| 2 × 10$^{18}$ | 1120 ("a-axis") | 79 |
| 2 × 10$^{18}$ | 0001 ("c-axis") | 35 |
| 2 × 10$^{18}$ | 0001 ("c-axis") | 28 |

It is clear that the mobility in the (0001) direction is much lower than that in the a-axis directions. Thus for the polytypes of SiC which have more anisotropic crystal structures, the use of specific orientations provides higher mobility and thus higher conductivity for device applications. Since the crystal structure is less anisotropic for 2H and 4H-SiC than for 6H-SiC, the mobility anisotropy is much less than in 6H-SiC. This approach is especially pertinent in the case of 6H-SiC which is the polytype that is the most readily available commercially, and, even though it does not have best properties, may be the practical selection for substrates.

To summarize, two methods are presented to achieve higher conductivities in SiC substrates and thus less power loss and more efficient operation in optical emitters. These are (1) to use higher mobility SiC polytypes, i.e. 2H and 4H-SiC, for the substrate and (2) to use specific orientations of anisotropic crystals to align the high mobility axis with the current flow direction, i.e. the a-axis orientation of the 6H-SiC polytype.

The high carrier mobility has two positive impacts on device performance. First, in the active region of the device, the mobility in the current flow direction is large, which results in improved device performance. Second, the substrate is a parasitic resistance in series with the device, and therefore, a high mobility will result in a low substrate resistance. Small substrate resistance means a lower forward voltage drop and less power consumed (wasted) in the substrate, i.e. a more efficient device. In addition, less heat will be generated as a result of the substrate resistance. It should be notes that SiC has a thermal conductivity is about 10 times larger than that of sapphire. This higher thermal conductivity aids in conducting heat away from the active junction region.

Figure 2:
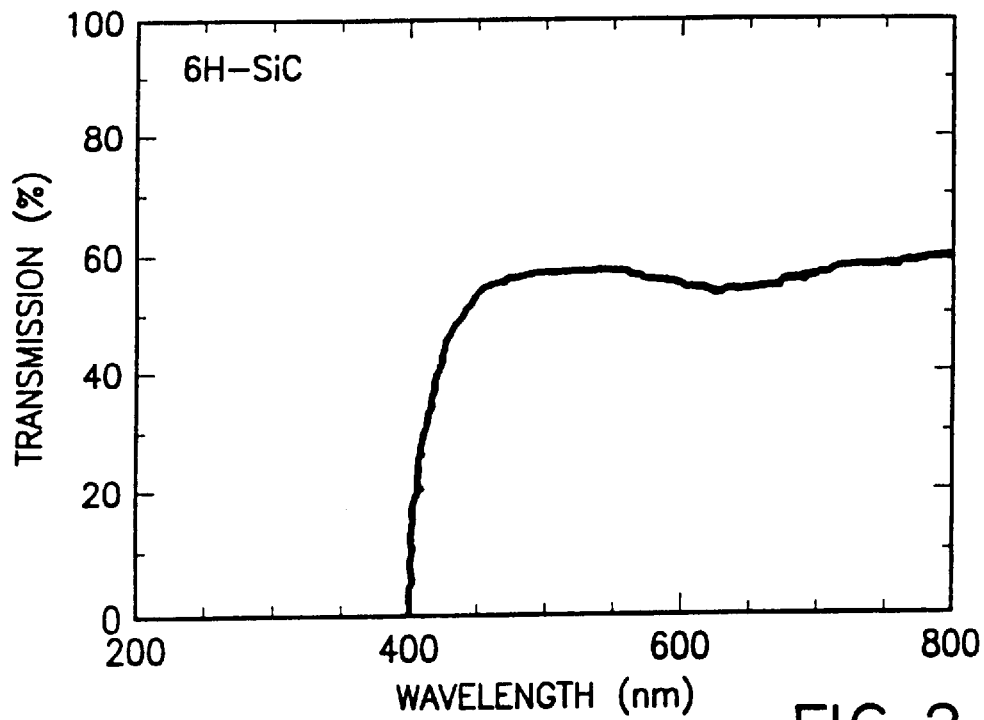
FIG. 2 shows percent transmission of light in the wavelength range 200 to 800 nanometers as a function of wavelength for 4H-SiC.
Figure 3:
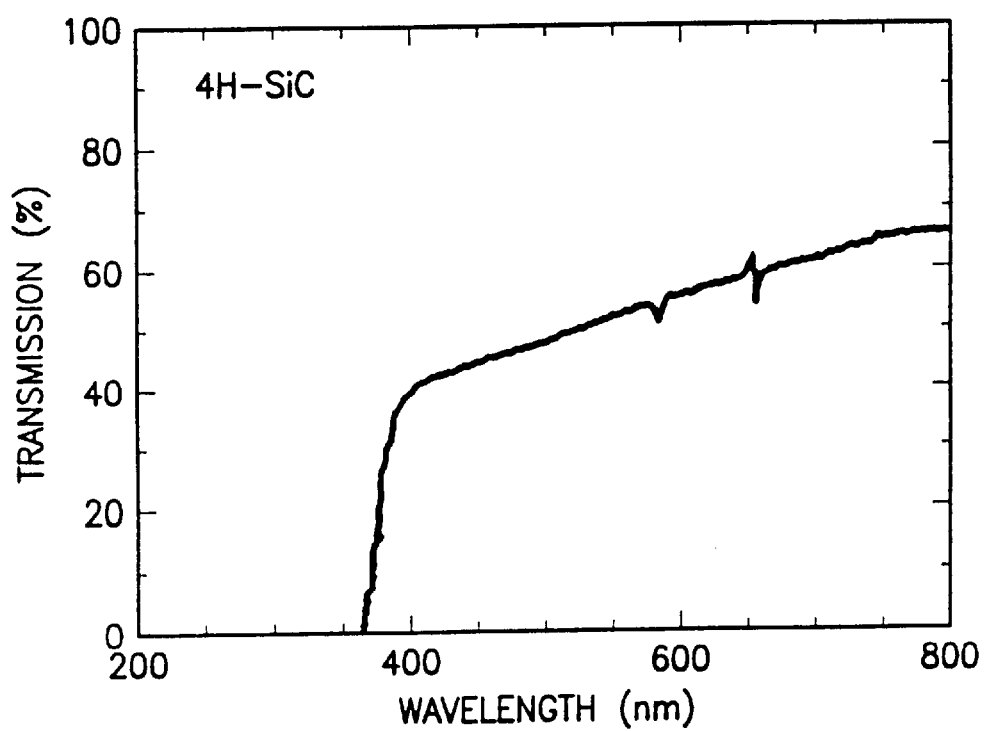
FIG. 3 shows percent transmission of light in the wavelength range 200 to 800 nanometers as a function of wavelength for 6H-SiC.

Optical properties of the substrate are also important. In this regard, another significant advantage of the 4H-SiC and 2H-SiC substrates relative to 6H-SiC is their larger band gaps. The larger band gaps make these substrates effectively transparent for shorter wavelength light emission. This means that 2H- and 4H-SiC substrates are effectively more transparent over a wider wavelength range than 6H- or 15R-SiC. Since in LEDs a great deal of light can come from out of the substrate, the selection of 2H or 4H polytypes offers a significant advantage. FIG. 2 shows a graph of the percent transmission of light in the wavelength range 200 to 800 nanometers as a function of wavelength for 4H-SiC and FIG. 3 shows the corresponding graph of the percent transmission of light in the wavelength range 200 to 800 nanometers as a function of wavelength for 6H-SiC. It is clear that 4H is transparent over a wider wavelength range. Although the relative percent transmission numbers are not directly comparable because the percent transmission above the band edge wavelength also depends on the doping density, the wavelength at which transmittance goes to zero, or "cut-off" wavelength, is independent of the dopant concentration.

As FIGS. 2 and 3 shows, the cut-off wavelength is significantly lower for the wider band gap 4H-polytype than for 6H-SiC, making this substrate suitable for light emitting devices that emit at higher energy ultraviolet wavelengths. The high energy transmission of 4H- and 2H-SiC enables higher efficiency LEDs that emit in the green-blue to ultraviolet range. High energy LEDs have uses in communications applications, where they can carry a higher density of information, and, in spectroscopy applications, where they can excite a wider range of energy level transitions.

As the concentration of dopants increases, transmittance decreases, and so conductivity and transmittance can be balanced in a trade-off situation. However, the higher carrier mobilities of the 2H-SiC, 4H-SiC and a-axis oriented 6H-SiC combined with high transmittance at short wavelengths allow doping levels to be selected for a device with optimized conductivity and transmittance, which has good electrical and optical properties.

Therefore, to summarize, substrates comprising hexagonal 2H-, 4H- and a-axis oriented 6H-SiC polytypes are preferred, and of the hexagonal polytypes, the 2H-SiC and 4H-SiC polytypes, which have wider band gaps than the 6H-SiC polytype, as well as higher carrier mobilities, are most preferred.

In contrast to the use of SiC as a substrate for GaN growth, many different types of devices have been made in SiC. Virtually all of these devices have been made on c-axis (0001) oriented 6H-SiC substrates. For all hexagonal SiC polytypes, there are actually two specific low index directions perpendicular to the c-axis: (10$\overline{1}$0) and (11$\overline{2}$0), which are generically called "a-axis." To date only one device has been proposed to be made on an a-axis oriented substrate. This is in an IMPATT development program at Westinghouse, funded by the Naval Weapons Center at China Lake, Calif. ("High Power Silicon Carbide IMPATT Diode Development," Eldridge et al., 2nd Annual AIAA SDIO Interceptor Technology Conference, Jun. 6–9, 1993, Albuquerque, N.M.). This IMPATT device is an electronic, not an optical device. The a-axis was chosen in this prior art work to achieve certain ionization rates when the device is operated in avalanche (reverse bias) conditions, which are totally different from the reasons for using a-axis orientation for LED or laser devices. Additionally, the device operating conditions are totally different (LED and laser devices operate in small forward bias conditions). To date, no actual devices have been reported to have been made on a-axis oriented substrates. GaN LEDs and lasers made on a-axis oriented SiC provide many advantages that have evidently not been previously appreciated.

While LEDs made using 6H-SiC epilayers on 6H-SiC substrates have been reported previously (U.S. Pat. No. 4,918,497), and GaN LEDs were described on c-axis (0001) oriented 6H-SiC substrates (U.S. Pat. No. 5,210,051), to date, there have been no reports of GaN-based optical devices (LEDs or lasers) grown on 2H-SiC, 4H-SiC or a-axis 6H-SiC substrates. See Y. Ueda, T. Nakata, K. Koga, Y. Matsushita, Y. Fujikawa, T. Uetani, T. Yamaguchi and T. Niina, Mat. Res. Soc. Symp. Proc. vol. 162, 1990 Materials Research Society, "Liquid Phase Homoepitaxial Growth of 4H-SiC Crystals and fabrication techniques of bluish-purple light emitting diodes."

Moreover, in combination with epilayers of the AlGaInN alloys, whose wavelength of light emission can be selected by modifying composition and thickness, these wider band gap polytypes show distinct and previously unappreciated advantages.

When the advantages of the electrical and optical properties of 2H-, 4H- and a-axis oriented 6H-SiC substrate s are combined with growth of Ga* N-based active regions, with their high optical efficiency, a new high power optical emitter device structure is produced. GaN and related materials are very efficient optically because of their direct band gap. In addition, the ability to make heterostructures with alloys of AlN and InN enables heterostructure devices as well as the ability to select the output wavelength by choice of composition and/or thickness of the active region.

Figure 4:
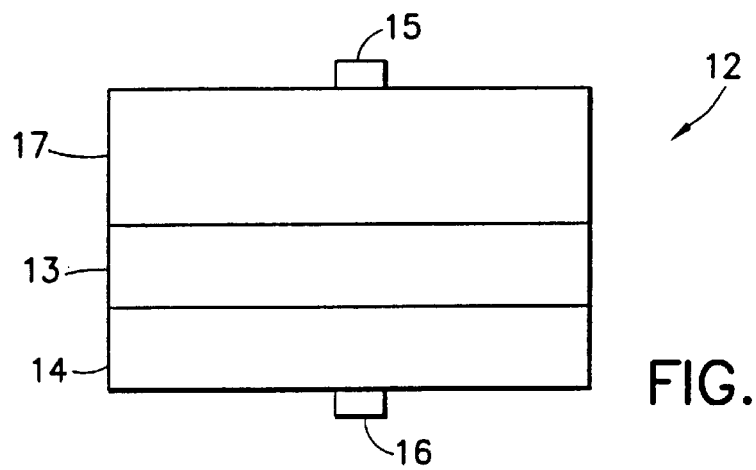
FIG. 4 shows a schematic of a light emitting diode according to the present invention, comprising a conductive SiC substrate, a Ga*N active region, a heavily doped Ga*N contact layer, and top and bottom electrical contacts.

FIG. 4 is a schematic sectional elevation view of a generalized LED structure 12 according to the present invention. The LED structure 12 comprises a green-blue to ultraviolet light emitting Ga*N material 13 on a base structure 14 comprising a SiC substrate. The diode structure 12 includes a p-n junction comprising Ga*N layers 13 and 17, a contact 15 on the upper sur f ace of the Ga*N layer 17, and a contact 16 on the bottom surface of the base structure 14. The substrate is selected from any orientation of 2H-SiC or 4H-SiC, or a-axis oriented 6H-SiC.

Figure 5:
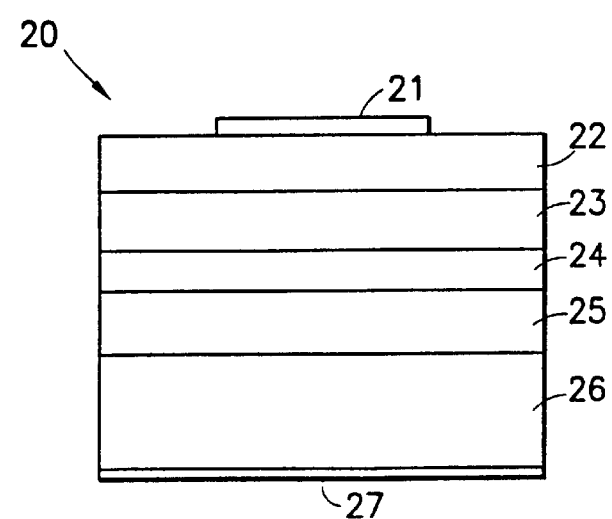
FIG. 5 shows a schematic of a light emitting diode according to the present invention, comprising a conductive n-type 4H-SiC substrate, an n-type AlGaN barrier layer, a GaN active region, a p-type AlGaN layer, and a heavily doped p-type GaN contact lay incorporating a p-type contact to the top and an n-type contact to the bottom.

A schematic of an electroluminescent device according to the invention is shown in FIG. 5. The device 20 has a conductive substrate 26. The substrate may be n-type or p-type. On the substrate is formed a Ga*N barrier layer 25, a Ga*N active region 24 and a Ga*N barrier layer 23. Finally the structure is completed with a heavily doped contact layer 22, wherein "heavily doped" means a doping level of $\geq 10^{18}$ cm$^{-3}$, and preferably $\geq 10^{19}$ cm$^{-3}$. Contact 21 is formed to heavily doped contact layer 22 and contact 27 is formed to the conductive SiC substrate 26 on the lower sides of the device. The Ga*N layers 23 and 25 have a larger band gap than the Ga*N active region, which confines the injected carriers and prevents them from diffusing out of the active region. This results in greater optical efficiency. The contact layer 22 should have as small a band gap as possible, making top contact formation easier. The device is fabricated by making a contact to the top and a contact to the bottom. The wafer is then diced up into individual devices.

In one embodiment of the device of the general type shown in FIG. 5, the device 20 has a conductive, n-type 4H-SiC substrate 26. On this substrate is formed a n-type AlGaN barrier layer 25, a GaN active region 24 and a p-type AlGaN layer 23. Finally the structure is completed with a heavily doped p-type GaN contact layer 22. Contact 21 is formed to the heavily doped p-type GaN contact layer and contact 27 is formed to the n-type SiC substrate on the lower sides of the device. The AlGaN layers have a larger band gap than the GaN active region, which confine the injected carriers and prevents them from diffusing out of the active region, leading to greater optical efficiency. The p-type GaN contact layer has a smaller band gap than the AlGaN, making top contact formation easier. The device is fabricated by making a p-type contact to the top and an n-type contact to the bottom. The wafer is the n diced up into individu al devices.

Doping the Ga*N layers p-type can be achieved using Mg, C, or Zn as the dopant, introduced during growth, with Mg preferred. Source reagents such as $CCl_4$ (carbon dopant), bis(cyclopentadienyl)magnesium (Mg dopant), diethylzinc or dimethylzinc (Zn dopant), etc. may be employed to supply the dopants during deposition. P-Type dopants can be activated by thermally annealing in a non-hydrogen-containing ambient (Ar, $N_2$, but not $NH_3$) or by LEEBI (low energy electron beam irradiation). However, the latter technique works only to the depth of the beam penetration, e.g. only a few microns using energies that are easily accessible in an electron microscope source.

Doping of the Ga*N layers n-type can be achieved in situ using Si, Se, or Te as dopant, introduced during growth, with Si preferred. Silane, disilane, hydrogen selenide or telluride, or organometallic Si, Se, or Te compounds are suitable precursors for the introduction of these dopants during growth. Contact materials that are suitable for the top contact include Ti/Mo/Au, Au/Ni or Au/Ge/Ni alloys or Au metal. For the bottom contact to the silicon carbide substrate, Ni. Pd, W or Ta may be employed.

It should be understood that the compositions of the barrier and active regions of the device shown in FIG. 5 may be modified to achieve different performance. The major aspect determining the composition of the active region is the desired output wavelength. This is determined by the band gap of the active region. The band gaps vs. lattice constants for a number of materials including the III-V nitrides are tabulated in Table II below.

TABLE II

| Material | Band Gap | Lattice Constant |
| --- | --- | --- |
| AlN | 6.28 | 3.112 |
| GaN | 3.45 | 3.16 |
| InN | 2.09 | 3.544 |
| AlP | 2.45 | 5.467 |
| GaP | 2.26 | 5.4512 |
| InP | 1.35 | 5.8686 |
| AlAs | 2.15 | 5.6605 |
| GaAs | 1.42 | 5.65325 |
| InAs | 0.36 | 6.0584 |
| ZnS | 3.68 | 5.42 |
| CdS | 2.42 | 5.8320 |
| CdSe | 1.70 | 6.050 |
| CdTe | 1.56 | 6.482 |
| Si | 1.12 | 5.43095 |
| 3C-SiC | 2.2 | 4.36 |
| 6H-SiC | 2.9 | 3.09 |
| ZnO | 3.35 | 4.580 |
| Sapphire | — | 4.758 |

It is clear that adding AlN to GaN increases the band gap while adding InN to GaN decreases the band gap. The band gap of GaN is 3.4 eV which corresponds to a wavelength for band-to-band light emission of about 365 nm. For a blue LED, the wavelength should be in the range of 440 to 480 nm, which requires the addition of 5–50 mole % In to a GaN active region. In other words, the active region should have a composition of $In_xGa_{1-x}N$ where 0.05<x<0.50 to produce a blue LED. This range will produce different shades of blue. This wide range is specified because the emission may come from band-to-band or impurity recombination. If it is band-to-band, then the output wavelength is clearly determined by the band gap. On the other hand, if it is impurity related recombination, then the output wavelength is less than the energy of the band gap by approximately the ionization energies of the dopants. The structure depicted in FIG. 3 can be used to provide light emission from the UV to visible by appropriate variation of the compositions in the active layer 24.

In another embodiment of an LED emitting in the blue region of the optical spectrum, x in the composition $In_xGa_{1-x}N$ ranges from 0.05<x<0.50, preferably in the range of 0.07<x<0.15. In the $Al_yGa_{1-y}N$ barrier layers, y could vary from 0 to 0.3, preferably 0 to 0.15.

An alternative version would use a p-type substrate, a p-type barrier layer followed by the active region and an n-type barrier layer and n-type contact layer.

It is also understood that the lower band gap contact layer on the top of the structure may be made of an InGaN alloy or InN for improved contacts, or alternatively the contact layer may be omitted.

Other versions of this device utilizing the conductive SiC substrate could have active regions made out of quantum wells. In this case, the active region is thin enough that quantum size effects as well as layer composition control the emission wavelength. in this case the emission wavelength is determined by the well width, the well composition and the barrier composition. In general, as the well width is decreased, the emission energy is increased.

The active region may also consist of a Ga*N material of lower band gap than the cladding layers 23 and 25, but instead of having an active region of uniform composition, could have one or more wells of Ga*N layers of even lower band gap material than the bulk of the active region. The carriers will thermalize into those wells and emit light with a wavelength dependent on the band gap and thickness of the well materials.

An additional structural modification to increase the light output employs a dielectric Bragg mirror underneath the LED structure. The Bragg mirror structure may suitably comprise sequential layers of metallonitride materials (compounds or alloys), e.g. alternating layers of AlN, GaN, InN or their alloys, "Ga*N," where the term Ga*N refers to binary (e.g. GaN), ternary (MGaN), and quaternary (MM'GaN) type gallium nitride compounds, including, by way of example, such compounds as AlN, InN, AlGaN, InGaN, InAlN and AlInGaN, wherein M is a metal which is compatible with Ga and N in the composition MGaN and the composition MGaN is stable at standard temperature and pressure (25° C. and one atmosphere pressure) conditions, and wherein M' is a compatible metal providing quaternary compounds of the formula $M_{1-x-y}M'_yGa_xN$, wherein x and y range from 0 to 1.

Figure 6:
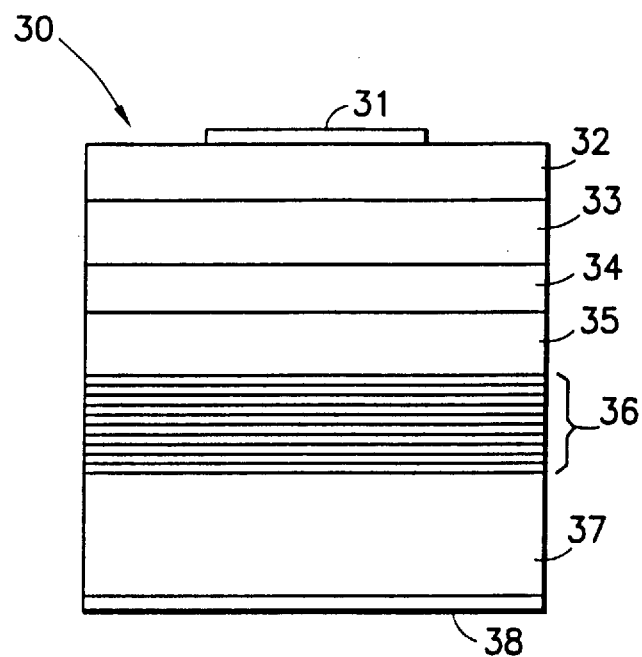
FIG. 6 shows another embodiment of an LED according to the present invention, incorporating a structural modification to increase the light output comprising a dielectric Bragg mirror beneath the LED structure, made of alternating layers of AlN, GaN, InN or their alloys.

This Bragg mirror structure acts as a mirror for specific wavelengths, and increases the light output by efficiently reflecting light up and out of the device. FIG. 6 shows a schematic of this type of structure, where the light emitting device 30 comprises a silicon carbide substrate 37, wherein the silicon carbide substrate is preferably of the 2H, 4H, or a-axis 6H polytype, upon which is grown a Bragg mirror 36 comprising alternating layers of AlN, GaN, InN or their alloys. A barrier layer 35 of n-type Ga*N is grown on the Bragg mirror, followed by the active region 34 which may comprise Ga*N, and a p-type Ga*N layer 33. Finally the structure is completed with a heavily doped p-type Ga*N contact layer 32, wherein "heavily doped" means a doping level of $\geq 10^{18}$ cm$^{-3}$, and preferably $\geq 10^{19}$ cm$^{-3}$. Contact 31 is formed to heavily doped p-type Ga*N contact layer and contact 38 is formed to the SiC substrate on the lower sides of the device. As described previously, the Ga*N layers 33 and 35 have band gaps larger than the active region 34. The contact layer has as small a band gap as possible or may be omitted. Of course, the doping scheme could be reversed, using a p-type substrate, and so forth.

The Bragg reflector acts as a frequency-dependent mirror, that is the peak in the reflectivity spectrum is determined by the layer thicknesses in the structure. The design of the Bragg reflector is governed by the dielectric reflector expression (W. Driscoll and W. Vaughan eds, "Handbook of Optics," McGraw-Hill, N.Y., 1978, Chp. 8.):

$$n_1 t_1 + n_2 t_2 = \frac{1}{2}$$

where $n_1$ and $n_2$ are the indices of refraction at the wavelength 1 and $t_1$ and $t_2$ are the thicknesses of the materials in the reflector. The total reflection from the reflector is given by:

$$Rmax = \{[(n_m/n_s) - (n_1/n_2)^{2N}]/[(n_m/n_s) + (n_1/n_2)^{2N}]\}^2$$

where N is the total number of periods of materials 1 and 2 and $n_i t_i$ for each of these layers is an odd multiple of ¼. The index $n_m$ is for the medium into which the light is reflected and $n_s$ is the index of the substrate on which the stack resides. This expression gives the peak reflectivity; the peak reflectivity decreases as the wavelength varies either higher or lower than 1.

The refractive index of AlN is reported to be $n_{AlN} \approx 2.1$. The refractive index of GaN in the blue part of the spectrum lies near $n_{GaN} 2.6-2.7$. Using these values along with the wavelength of maximum emission for a GaN diode of $\approx 430$ nm, the thicknesses of the GaN and AlN layers are 41 and 51 nm, respectively (assuming maximum reflection from the mirror). It should be noted that the index ratio for GaN/AlN is very similar to that of GaAs/AlAs, which indicates that highly reflective mirrors will be achievable.

To date there has been only one report of a Bragg reflector made in the AlGaN system. This utilized 18 periods of GaN and $Al_{0.2}Ga_{0.8}N$ layers. The peak reflectivity was measured to be 80% at 442nm for this structure (M. A. Kahn, J. N. Kuznia, J. M. Van Hove, D. T. Olson, Appl. Phys. Lett. 59, 1449 (1991)).

In addition to reflectivity, the resistance of the Bragg mirror is also very important. Current must flow through the reflector, and if it has a high resistance, thermal heating and device degradation occur. Even if device destruction does not occur, overall device efficiency will suffer. One problem with the simple Bragg reflector is that the potential barriers in the superlattice (which result from different band gaps of these materials) impede the carrier flow and result in large series resistances.

There are a number of methods for reducing the series resistance of the Bragg reflector. The first is to make the material in the reflector as conductive as possible. However this does not reduce the potential barriers in the conduction and valence band. These barriers can be reduced by grading the composition at the interface instead of having an abrupt change. Grading can be done in two ways. The first is to change the flux of the constituent species as a function of time. The second is to insert either a layer of intermediate composition or a short period superlattice at the interface between the two main layers.

LEDs are made in the simplest possible way to achieve low costs and high yield.

Many LEDs are defined simply by the dicing operation that occurs to separate them. Damage induced at the edge of the LED during the dicing operation may cause a decrease in the radiative efficiency or lifetime of the device. Such damage is often removed by performing an etch after dicing to remove the damaged material.

The present invention encompasses an alternative to such etching, which involves fabrication of the individual devices by a mesa etching technique which provides an alternative structure which does not require this etching. Device definition may thus be performed during the fabrication step to keep damage from the dicing operation away from the active region.

Figure 7:
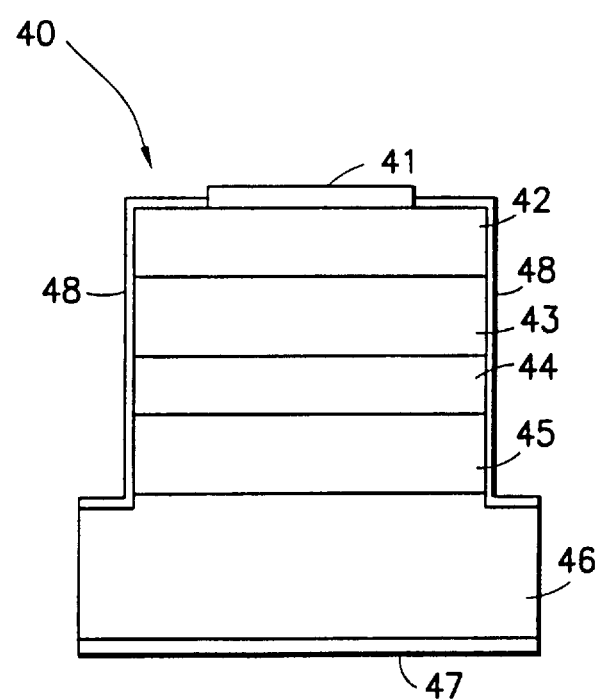
FIG. 7 shows a device which is defined during device fabrication by a process comprising mesa etching, passivation of the mesa edge and contact formation, to produce a device in which the critical p-n junction edge region is removed from the dicing region.

The conventional LED structures are shown in FIGS. 4 and 5. These devices are defined by the dicing operation. FIG. 7 shows a device which is defined during device fabrication by a process consisting of mesa etching, passivation of the mesa edge and contact formation. Finally the wafer is diced to separate the devices. The major difference between this structure and the one shown in FIG. 5 is that in the mesa device, the critical p-n junction edge region is spatially separated from the dicing region. This prevents any dicing damage from encroaching into the active region, which may degrade the device characteristics.

In FIG. 7, the LED 40 comprises a silicon carbide substrate 46 followed by a n-type Ga*N barrier or cladding layer 45, a Ga*N active layer 44, and a p-type cladding Ga*N layer 43, and a heavily doped p-type Ga*N contact layer 42. Contact 41 is formed to heavily doped p-type GaN contact layer and contact 47 is formed to the SiC substrate on the lower sides of the device. A passivation layer 48 protects the device from degradation and reduces surface leakage currents. The passivation layer may comprise silicon dioxide, silicon nitride or other materials. Layers of these materials are deposited using chemical vapor deposition, sputtering, plasma-assisted deposition, or other layer-forming processes known in the art. The passivation layer thickness may range from 200 to 2000 Å. The cladding layers 43 and 45 have larger band gaps than the active layer 44. These devices are made by masking of the grown LED structure and etching the mesas after growth.

Typical metallurgy for the p-type contact uses aluminum or gold/aluminum alloys which are annealed at temperatures from 700° C. to 1000° C. N-type contact metallurgy includes Ni, W, Pd, and Ti. These metals are annealed at 800° C. to 1100° C. to form the contact, excluding Ti which is ohmic as deposited.

The wafer is then sawed using a dicing saw to produce individual LED devices. Because the p-n junction is spatially separated from the sawed edge, no post-sawing processing is required.

Defects pose a serious problem to light emitting devices; they can reduce the optical efficiency as well as shorten the lifetime of the device. Often optical devices have dark line defects which multiply during operation. With continued operation, the density of these defects increase until the light output is reduced tt an unacceptable level and device failure occurs. In structures according to the present invention, wherein a small lattice mismatch exists between the substrate and the epitaxial layers, and a smaller mismatch between the GaN and AlGaN layers, misfit dislocations due to these lattice mismatches are of potential concern.

These lattice mismatches may be addressed in three ways. The first is the use of buffer layers including single composition layers as well as superlattices and strain layer superlattices. The second method is to perform the growth on reduced area mesas which results in a reduction in dislocation density in the epitaxial layers. Finally the choice of a SiC substrate, because of its high thermal conductivity, will keep the junction temperature lower and result in much lower rate of defect propagation. In addition, the closer thermal coefficient of expansion match between GaN and SiC compared to GaN and sapphire greatly reduces the density of dislocations generated during cooldown after growth of the epitaxial layers.

As discussed above. the main lattice mismatch comes between the substrate and epitaxial layers. By choosing a SiC substrate instead of the more typical sapphire, the mismatch can be reduced from 13.8 to about 0.9–3.4%, depending on the alloy composition. This will result in a large reduction in misfit dislocation density at the substrate/epitaxial layer interface. The misfit can be minimized by using high Al alloy compositions in the cladding layer, which make up most of the device volume. In addition, the closer TCE values will result in fewer defects generated during cool-down after epitaxial growth. The TCE value for GaN is about 5.6 versus 5.1–5.9 for SiC (range of literature values) and about 7.5 for sapphire. Thus, the use of SiC instead of sapphire will result in improved surface morphology, less wafer warpage as well as a reduction in dislocation density due to mismatches in TCE. Still, the thicknesses required for these optical devices (LED, laser) will exceed the critical thickness for misfit dislocation generation and additional approaches are used to mitigate these.

A buffer layer may be provided between the substrate and epitaxial layer as a manner of dealing with misfit dislocations in the growth of lattice mismatched materials. Both AlN and GaN buffer layers have been used to advantage with the nitrides on sapphire substrates. In addition, more sophisticated buffers, for example strained-layer (Al,Ga)N superlattices, may be employed to further reduce the defect density. This type of buffer can be used in the III-V arsenides to reduce dislocation densities by about a factor of 10.

A major problem with the growth of GaN on SiC substrates is cracking of the epi-layer. This is likely due to differences in the lattice constants and thermal expansion coefficients of GaN and SiC, which cause cracking when the samples are cooled from the growth temperature (~1000° C.) to room temperature. Cracking of the GaN epi-layers is a severe problem for the fabrication of electronic and optical devices from these materials.

As shown in Table III below (see "Properties of Group III Nitrides," Edgar, J. H., INSPEC, London, 1994), GaN layers grown on sapphire are compressed since the thermal coefficient of expansion (TCE) of GaN is smaller than that of sapphire. Conversely, GaN has a larger TCE than SiC so the layers are under tensile strain. The TCE of AlN is only slightly smaller than that of SiC.

TABLE III

| Material | Symmetry | Lattice Constant (Å) | Mismatch to GaN | Thermal Expansion Coefficient ($\times 10^{-6}$/K) |
|---|---|---|---|---|
| Wurtzite GaN | Hexagonal | a = 3.189 | — | 5.59 |
|  |  | c = 5.185 |  | 7.75 |
| Wurtzite AlN | Hexagonal | a = 3.112 | 0.024 | 4.15 |
|  |  | c = 4.982 |  | 5.2 |
| Basalplane Sapphire | Hexagonal | a = 4.758 | 0.138 | 7.5 |
|  |  | c = 12.991 |  | 8.5 |
| 6H-SiC | Hexagonal | a = 3.08 | 0.034 | 4.2 |
|  |  | c = 15.12 |  | 4.68 |

SiC has a much closer lattice match to GaN (3.4%) than does sapphire. While an AlN layer grown at low temperature has been used as a buffer for growth of GaN on SiC, improved crystal properties have been obtained by growing a thin, approximately 1000 Å AlN buffer at temperatures greater than 1000° C. (T. W. Weeks, M. D. Bremser, K. S. Ailey, E. Carlson, W. G. Perry and R. F. Davis, GaN Thin Films Deposited via Organometallic Vapor Phase Epitaxy on 6H-SiC (0001) using High-Temperature Monocrystalline AlN Buffer Layers, Appl. Phys. Lett. 67 (1995) 401.)

It is noted that the mismatch between GaN and $Al_2O_3$ in Table III is 13.8%, not 33% which would be expected from the lattice constants, because the GaN rotates perpendicular to the c-axis to align [2110] GaN with [0010] sapphire.

In the context of prior usage of thin AlN layers as buffers for GaN growth on SiC, it is noted that AlN has a closer lattice match and thermal expansion coefficient (TCE) to 6H-SiC than GaN. In actual growth of GaN layers on 10000 Å AlN buffer layers on SiC, the GaN layers crack due to the larger differences in the TCE between GaN and AlN or SiC.

Thus, the parallel cracks that extend across the entire GaN layer, when GaN is grown on SiC substrates using AlN buffers, are due to TCE differences between GaN and AlN (2.4%) and AlN and SiC (1.0%).

A transition buffer layer has been used to decrease the extent of GaN film cracking when growing on SiC (J. A. Edmond, V. Dmitriev, K. Irvine, Buffer Structure Between Silicon Carbide and Gallium Nitride and Resulting Semiconductor Devices", U.S. Pat. No. 5,393,993). This transition buffer contains 3 layers which are described as a top (Al,Ga)N layer (%Al>%Ga) an intermediate (Al,Ga)N layer (%Ga>%Al) and a bottom AlN layer. There is still, however, a large lattice mismatch between the GaN layer and the top (Al,Ga)N layer of the buffer (>1.4%) in this structure which introduces strain into the GaN layer. Among the thin AlN layers grown at high temperature that were used as buffers for GaN growth on SiC, according to this U.S. patent, was the buffer layer $Al_{0.90}Ga_{0.10}N/Al_{0.30}Ga_{0.70}N/AlN$.

The inventors herein have discovered a buffer structure which eliminates cracking, comprising a compositionally graded (Al,Ga)N buffer layer between the SiC substrate and the GaN epi-layer. More specifically, we have found that improved GaN structural properties, as determined by x-ray double crystal rocking curve measurements, can be obtained by using a high temperature AlN buffer. The full-width-at-half-maximum (FWHM) for the (0004) GaN reflection is 270 arc-sec with an AlN buffer grown at 1100° C. on 6H-SiC, compared to 428 arc-secs when AlN grown at 550° C. is used as a buffer on 6H-SiC.

The inventors herein have demonstrated that crack-free GaN epi-layers several microns thick can be grown on 6H-SiC using an $Al_xGa_{1-x}N$ buffer layer where the Al composition (x) is graded from 1 at the buffer-SiC interface to 0 at the GaN-buffer interface. The purpose of the compositional grading is to gradually vary the lattice constant and thermal expansion coefficient from that of AlN to that of GaN.

By contrast, a corresponding GaN layer grown on a 1000 Å thick AlN buffer on 6H-SiC exhibited extensive film cracking.

It is to be noted here that the method of the present invention permits the low temperature step characteristic of prior art processes to be eliminated, so that growth temperatures on the order e.g., of 1000°–1100° C. can be used for processing, As a result, the process of the present invention affords distinct advantages in terms of ease of growth over the prior art, without the occurrence of cracking of the epi-layer.

Figure 8:
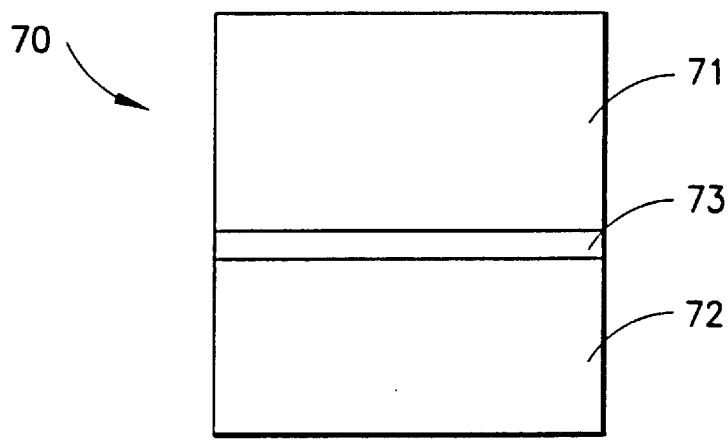
FIG. 8 shows a GaN/SiC composite including a GaN layer grown on a compositionally graded (Al, Ga)N buffer layer on a SiC layer.

FIG. 8 shows a GaN/SiC composite 70 including a GaN layer 71 grown on a compositionally graded (Al, Ga)N buffer layer 73 on a SiC substrate 72, where in the compositionally graded buffer, $Al_xGa_{1-x}N$, x' varies from 1 at the bottom to 0 at the top. The thickness of such graded buffer can range from 200 Å up to 5 μm, with a preferred range being from 500 Å up to 1 μm.

Figure 9:
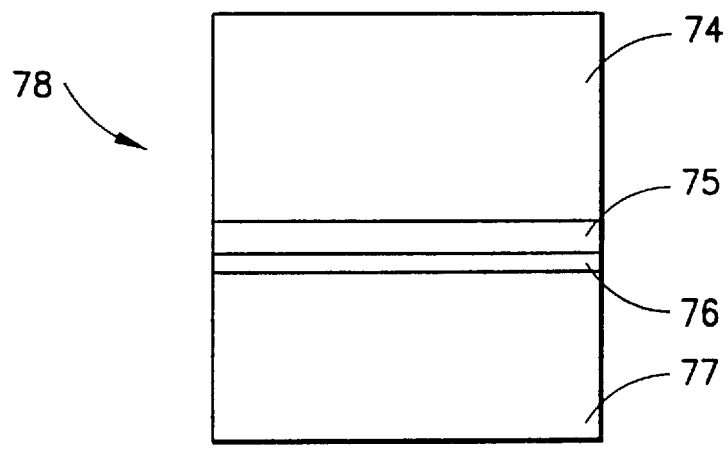
FIG. 9 shows a variation of the structure shown in FIG. 8, in which the GaN/SiC composite includes a thin AlN buffer layer is initially grown on a SiC substrate followed by the compositionally graded (Al, Ga)N buffer layer and a GaN epi-layer.

FIG. 9 shows a variation of the structure shown in FIG. 8, in which the GaN/SiC composite 78 includes a thin AlN buffer layer 76 is initially grown on SiC substrate 77 followed by the compositionally graded (Al, Ga)N buffer layer 75 and the GaN epi-layer 74. The thickness of the AlN buffer layer 76 can range from 50 Å up to 5 μm, with a preferred range being from 100 Å up to 1 μm.

In a structure of the type as shown in FIG. 8, with a 6 μm thick GaN epi-layer grown on a compositionally graded (Al, Ga)N buffer on 6H-SiC, no cracks were observed in the epi-layer. Additionally, the GaN epi-layers grown on compositionally graded (Al, Ga)N buffers on SiC exhibit superior structural and optical properties.

The buffer layers described above provide good morphological results, but because of the use of AlN, which is difficult to make conductive, the buffer is not conductive enough to use in devices where the substrate acts as one contact of the device, i.e., where current must flow through the buffer layer.

According to another aspect of the invention, a conductive buffer layer can be fabricated as a variation of the compositionally graded buffer layer described hereinabove. In such conductive buffer layer, the initial $Al_xGa_{1-x}N$ layer starts with a lower Al composition layer that can be doped to make it highly conductive in character, with x for this starting composition being in the range of from x=1 to x=0.3, preferably with x between 0.7 to 0.4. The corresponding end composition could be GaN or a lower $Al_yGa_{1-y}N$ composition, where y<x. The use of the composition $Al_yGa_{1-y}N$ instead of GaN as the final composition in the grade may be particularly useful when the epitaxial layer to be grown on the buffer is (Al, Ga)N instead of GaN.

The conductive buffer layer described above may be made conductive by doping with any suitable dopant species, so that the layer is of the desired n-type or p-type. Illustrative of suitable n- and p-type dopant species which may be widely varied and usefully employed in the broad practice of the present invention are silicon and magnesiun, respectively.

The buffer layers described hereinabove are made of (Al, Ga)N compositionally graded layers. They could also be made of (Al, In)N or (Al, Ga, In)N compositionally graded layers.

If the epitaxial layer to be grown on the buffer contains In, then it will be advantageous to continue the compositionally graded buffer layer to the (In, Ga)N, (In. Ga)N, or (Al, Ga, In)N composition of the epitaxial layer. For example, if the epitaxial layer is $In_{0.1}Ga_{0.9}N$, then the buffer structure may illustratively begin with AlN and grade through (Al, Ga)N to GaN and then continue grading from GaN to $In_{0.1}Ga_{0.9}N$.

A second defect reduction technique is to grow on reduced-area mesas. This technique has been used in the GaAs/InGaAs and Si/SiGe material systems. For example, a reduction in linear interface dislocation density with decreasing mesa diameter is observed for 7000 Å of $In_{0.05}Ga_{0.95}As$ grown on GaAs. A significant reduction occurs as the diameter is reduced from 200 to less than 50 μm. The mechanism for this dislocation reduction is that, because of the small area, dislocations are able to move to the edges of the pedestal and annihilate there before encountering and interacting with other dislocations. LEDs typically have an active region of about 170 μm in diameter and so we expect some dislocation reduction by growing on a mesa of this diameter.

Lattice mismatch between a SiC substrate and the Ga*N epi-layer grown on top of it introduces misfit dislocations into the epi-layer. These defects degrade the structural, optical and electrical properties of the epi-layer and therefore have an adverse effect on the operating characteristics of devices fabricated from the material To reduce the formation of defects in Ga*N epi-layers grown on SiC, and thereby improve the structural and optical properties of Ga*N epi-layers grown on SiC substrates, reduced-area mesas are formed on the SiC substrate prior to epi-layers growth.

In Ga*N systems, small-area mesas reduce linear interface dislocation density. Due to the small area of the mesa, dislocations are able to move to the edges of the pedestal and annihilate there before encountering and interacting with other dislocations. As a result, the structural and optical properties of Ga*N epi-layers and quantum wells grown on reduced-area mesas on SiC substrates are significantly improved.

The present inventors have grown both GaN single layers and $Al_{0.15}Ga^{0.85}N$/GaN quantum well structures with GaN well widths of 150 Å and 750 Å on reduced-area mesa SiC substrates. Growth on the reduced-area mesas results in an improved surface morphology of the GaN films. The material on top of the mesa is much smoother than that of the surrounding region.

Figure 10:
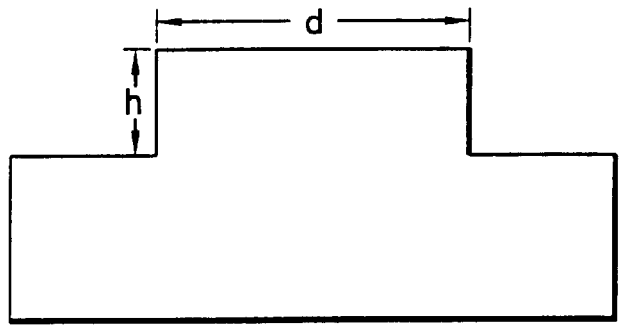
FIG. 10 shows an individual mesa suitable for fabricating a semiconductor device or precursor thereaccording to the invention.

FIG. 10 shows an individual mesa prepared as above. The mesas are typically squares, with a side dimension ranging from 150 to 200 μm, with 160 to 180 microns preferred. Their "equivalent diameter" dimension d ranges from 150 to 300 μm, with 250 to 300 μm preferred. As used herein, the term "equivalent diameter" means the diameter of a cylindrical shaped mesa which is equivalent in mesa top surface area to the mesa being considered. Thus, when the mesa in fact is of cylindrical shape and circular cross-section, the equivalent diameter is equal to the actual diameter measured on the circular top surface. For a polygonal or irregularly shaped mesa top surface, the top surface area may be used to determine the diameter of a circular cross-section of the same quantitative top surface area. The mesa height h relative to the substrate plane ranges from 1 to 15 μm, with 3 to 8 μm preferred.

Figure 11:
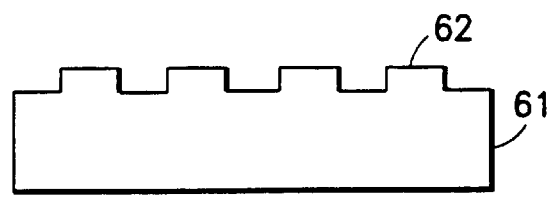
FIGS. 11, 12, and 13 show a schematic representation of an exemplary process used to produce mesa-defined devices in accordance with the invention.
Figure 12:
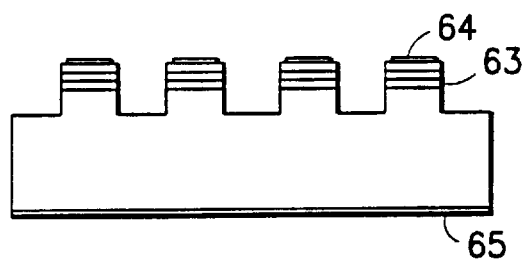
Figure 13:
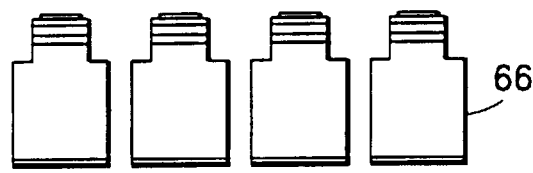

FIGS. 11, 12, and 13 show a schematic representation of an exemplary process used to produce such mesa-defined devices. The substrate 61 is first patterned with mesas 62 of the desired shape and dimension. Mesas may preferably be either circular or square, with circular preferred, having 150–300 μm equivalent diameter, preferably in the range of 200–250 μm. The substrate is patterned with metal (Ni, Al) which has been photolithographically patterned to the shape of the desired mesas. The non-masked areas are etched using reactive ion etching to a depth of 1–15 μm, and preferably 3–8 μm. The metal is then removed and the substrate is cleaned for epitaxial growth. The LED structure, which consists of layers 63, the active layers and cladding, is formed by successive steps of growth (described above). Again, the structures are masked with metal to protect the mesa tops, and to remove the material which was conformally deposited on the mesa sidewalls, another reactive ion etching step is performed. The metal may form the top contact 64 or it can constitute the mask, in which case another step is required to form the contact. A back metal contact 65 is deposited on the back of the wafer. After separation by a suitable technique, e.g. dicing, mechanical or laser scribing and cleaving, or sawing, the individual devices 66 are ready to be packaged.

The third approach to reducing the impact of defects arises from the use of the SiC substrate. Dark line defects are known to multiply because of device heating during operation. One way to reduce this effect is by reducing heating of the device. The SiC substrate has a thermal conductivity that is about 10 times greater than that of sapphire. Therefore, the junction region will be cooler, which will reduce the propensity of the defects to multiply, and thus extend device lifetime.

Methods for forming the device structures can be adapted from techniques that have been developed in SiC, GaAs and silicon materials and device processing technology. Single crystal silicon carbide substrates can be prepared by sublimation growth, as described by Tairov and Ziegler (Y. M. Tairov, V. F. Tsvetkov, J. Crystal Growth 43 (1978) 209; 52 (1981) 146; G. Ziegler et al., IEEE Trans. Electron Devices ED-30 (1983) 277)). GaN and other III-V nitride layers may be deposited by several techniques, including low and high pressure and plasma-enhanced chemical vapor deposition (CVD), reactive ionized-cluster beam deposition, reactive and ionized molecular beam epitaxy (MBE), and hydride vapor phase epitaxy (VPE). For n-type materials, doping of the III-V nitride is achieved typically using silicon from silane or disilane. Other n-type dopants include sulfur, selenium and tellurium. P-type doping has been more problematic in the III-V nitrides. One recent method is to use electron beam irradiation to activate dopants. The disadvantage of this approach is that it is a slow, expensive process and cannot be used in structures with arbitrary thickness.

The fabrication method of the present invention employs a combination of control of specific growth conditions as well as thermal annealing after growth to achieve active p-type dopants. Typical p-type dopants include Mg, Be, Zn, Cd and C.

Figure 14:
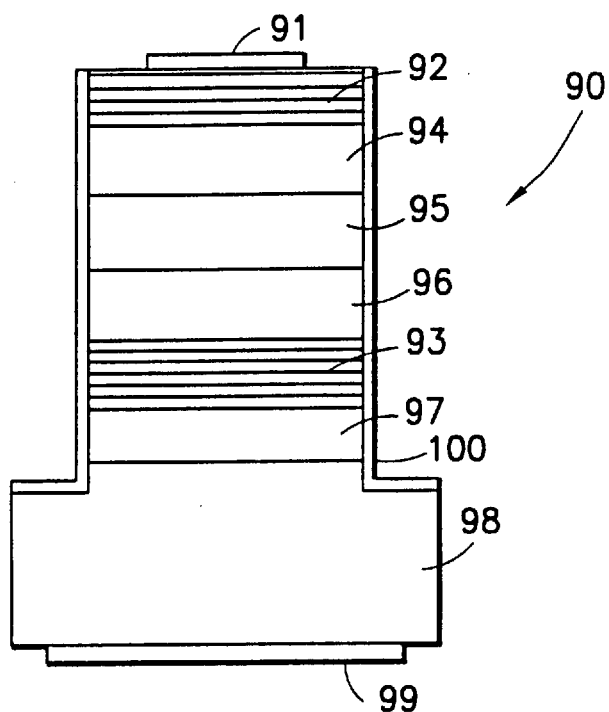
FIG. 14 shows a schematic representation of a semiconductor laser according to one embodiment of the present invention.

FIG. 14 shows a schematic representation of a semiconductor laser 90 according to the present invention. The laser comprises a top contact 91, top Bragg reflector 92, bottom Bragg reflector 93, cladding layer 94, active layer 95, cladding layer 96, buffer 97, substrate 98, bottom contact 99, and passivation layer 100. Other semiconductor laser structures can incorporate a key aspect of the invention, the green-blue to ultraviolet light emitting Ga*N material on a base structure comprising a SiC substrate selected from the group consisting of 2H-SiC, 4H-SiC and a-axis oriented 6H-SiC. Layers 94 and 96 have larger band gaps than layer 95, and are complementarily doped, one p-type and one n-type.

Figure 15:
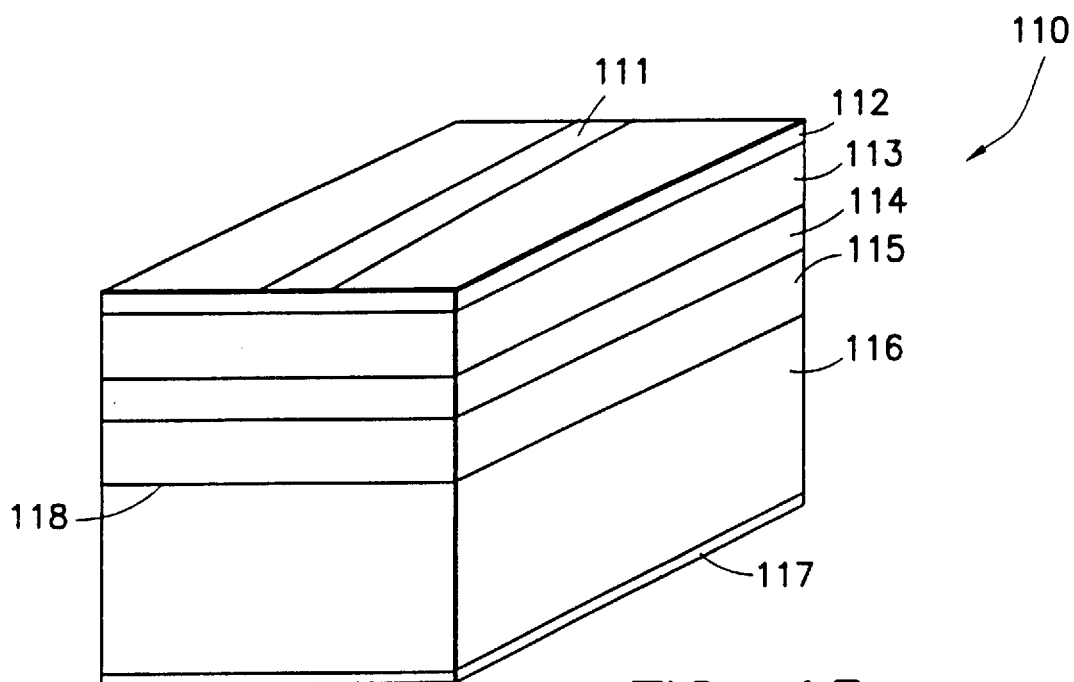
FIG. 15 depicts,another example of a laser structure according to the present invention.

FIG. 15 depicts another example of a laser structure 110 according to the present invention. Laser 110 comprises top contact 111, contact layer 112, cladding layer 113, active layer 114, cladding layer 115, substrate 116, and bottom contact 117. Face 118 and the corresponding face on the opposite side of the device constitute laser facets or mirrors. Light is emitted from the active layer on the facet sides, beneath the contact. Layers 113 and 115 have larger band gaps than 114, and are complementarily doped, one p-type and one n-type. Although not shown in the specific embodiment illustrated in FIG. 15, it is to be appreciated that the laser structure shown in FIG. 15 could employ a buffer layer between the cladding layer 115 and the substrate 116.

As discussed hereinabove, the present invention contemplates the use of buffer layers in Ga*N structures such as Ga*N/SiC semiconductor devices or precursors thereof, in which the buffer layers function to provide the overall structure with a good lattice match and a good coefficient of thermal expansion match between the layer of single crystal silicon carbide and the layer of gallium nitride.

The invention thus realates to gallium nitride semiconductor devices or precursor articles therefor, in which the device or precursor comprises a layer of single crystal silicon carbide and a layer of single crystal gallium nitride, having a buffer layer therebetween comprising a compositionally graded Ga*N layer.

Such compositionally graded Ga*N layer may suitably comprise a compositionally graded $Al_xGa_{1-x}N$ buffer layer between the gallium nitride and silicon carbide layers, wher e in x can range from 0 to 1, and wherein the buffer layer is compositionally graded from an interface of the the buffer layer with the silicon carbide layer at which x is 0, to an interface of the buffer layer with the gallium nitride layer at which x is 1. The buffer layer thus is varied across its thickness between the GaN and SiC layers sandwiching the buffer layer therebetween, so that the buffer layer at its respective extremeties provides good epitaxial and TCE match to the contiguous GaN and SiC layers bounding the buffer material.

Preferably, such buffer layer is graded smoothly from an initial value of x at the interface of the buffer layer with the SiC layer, to a final value of x at the other interface of the buffer layer with the GaN layer, with continuous progression of the stoichiometry of the buffer layer metal constiuents along the thickness thereof, however it is also possible in the practice of the invention to utilize a buffer layer which is graded in stepwise or incremental fashion along its thickness, or the variation of the stoichiometric change may be intermediate, or a combination of, such continous and step changes.

Thus, the invention contemplates a semiconductor device or precursor thereof, comprising a silicon carbide substrate and an epitaxial layer of gallium nitride, having a buffer layer therebetween comprising a compositionally graded (Al,Ga)N buffer layer. The SiC substrate may comprise 6H-SiC or other SiC polytypes, such as 2H-SiC or 4H-SiC, with the $Al_xGa_{1-x}N$ buffer layer wherein the Al composition (x) is graded from 1 at the buffer-SiC interface to 0 at the GaN-buffer interface. The thickness of such graded buffer layer may suitably range from 200 Å up to 5 μm, with a preferred range being from 500 Å up to 1 μm.

A variation of the above-described semiconductor device or precursor structure may comprise a thin AlN buffer layer which is initially grown on SiC followed bv the compositionally graded (Al, Ga)N buffer and the GaN epitaxial layer. The thickness of such AlN buffer layer can range from 50 Å up to 5 μm, with a preferred range being from 100 Å up to 1 μm.

As a variation of the above-described semiconductor device and precursor structures, the conductive buffer layer of the formula $Al_xGa_{1-x}N$ may include a lower Al composition layer that is doped to render it highly conductive in character, such that x is in the range of from x=1 to x=0.3, preferably with x being be tween 0.7 to 0.4. The corresponding end composition could be GaN or a lower $Al_yGa_{1-y}N$ composition, wherein y<x. The use of the composition $Al_yGa_{1-y}N$ instead of GaN as the final composition in the graded buffer layer may be particularly useful when the epitaxial layer to be grown on the buffer is (Al, Ga)N instead of GaN.

Any suitable dopant species and dopant concentrations may be employed within the skill of the art, to provide the buffer layer with a desired conductive character and functional operating characteristics. For example, the buffer layer may be doped to be n-type, by use of silicon as a dopant species. As another example, the buffer layer may be doped to be p-type, by use of magnesium as a dopant species.

More generally, the Ga*N buffer layers broadly described hereinabove may be formed of any suitable buffer layer material, such as an (Al, Ga)N compositionally graded layer, an (Al, In)N compositionally graded layer, or an (Al, Ga, In)N compositionally graded layer.

As yet another example, if an epitaxial layer to be grown on the buffer contains In, the compositionally graded buffer layer may be continued to the (In, Ga)N, (In, Ga)N, or (Al, Ga, In)N composition of the epitaxial layer, e.g., if the epitaxial layer is $In_{0.1}Ga_{0.9}N$, then the buffer structure may illustratively begin with AlN and grade through (Al, Ga)N to GaN, and then continue grading from GaN to $In_{0.1}Ga_{0.9}N$.

Figure 16:
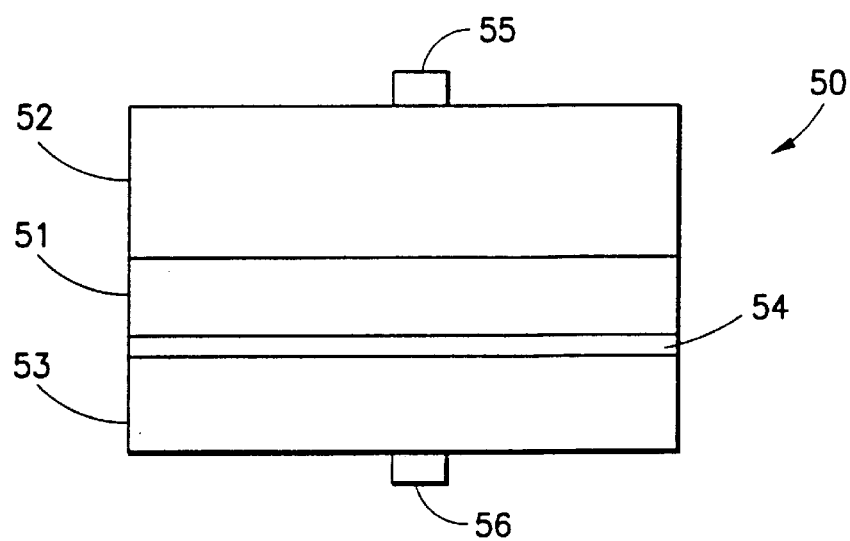
FIG. 16 shows a schematic sectional elevation view of a light emitting diode fabricated with a gallium nitride active layer, grown on a compositionally graded (Al, Ga)N buffer layer, on a silicon carbide substrate.

FIG. 16 shows a schematic sectional elevation view of a light emitting diode 50 fabricated with a gallium nitride active layer, grown on a compositionally graded (Al, Ga)N buffer layer 54, on a silicon carbide substrate. The LED 50 comprises a green-blue to ultraviolet light emitting GaN material 51 on a base structure 53 comprising a SiC substrate. The diode structure includes a p-n junction comprising GaN layers 51 and 52, a contact 55 on the upper surface of the GaN layer 52, and a contact 56 on the bottom surface of the SiC substrate base structure 53.

It will be appreciated that other of the Ga*N devices and structures described herein could also advantageously utilize a graded buffer layer intermediate the Ga*N layer and the SiC layer thereof.

The features and advantages of the invention are more fully shown by the following non-limiting, illustrative examples.

EXAMPLE I

SiC substrates were prepared with reduced-area mesas for subsequent GaN growth. The substrates were (0001) 6H-SiC with a misorientation 4° towards <11$\bar{2}$0>.

The fabrication process included the following process steps:
1. Lithography to define mesas on the SiC substrate..
2. Evaporation and lift-off of Ni to define circular mask area for etching.
3. Reactive ion etching of SiC to define mesas.
4. Removal of Ni and cleaning of SiC substrate.

Scanning electron microscopy (SEM) of reduced-area mesas etched in the SiC substrate showed the mesa height to be ~3 µm and the mesa diameters to vary from about 25 to 300 µm.

EXAMPLE II

GaN single layers and $Al_{0.15}Ga_{0.85}N$/GaN quantum well structures with GaN well widths of 150 Å and 750 Å were grown on reduced-area mesa SiC substrates. Growth on the reduced-area mesas resulted in an improved surface morphology of the GaN films. The material on top of the mesa was much smoother than that of the surrounding region.

EXAMPLE III

AlGaN/GaN quantum well structures were grown on reduced area mesa SiC substrates. Structure A consisted of a 750 Å thick GaN active region sandwiched between a 2000 Å $Al_{0.15}Ga_{0.85}N$ cap and a 3 µm thick $Al_{0.15}Ga_{0.85}N$ cladding layer. Structure B consisted of a 150 Å thick GaN active region between two 300 Å thick $Al_{0.04}Ga_{0.96}N$ layers between a 2000 Å $Al_{0.15}Ga_{0.85}N$ cap and a 3 µm thick $Al_{0.15}Ga_{0.85}N$ cladding layer.

Photoluminescence (PL) measurements were used to characterize the optical properties of the AlGaN/GaN hetero structures. These measurements were carried out at room temperature using a 325 nm He-Cd laser as the excitation source. Focusing optics were used to obtain a laser spot size on the sample of approximately 100 µm in diameter.

Figure 17:
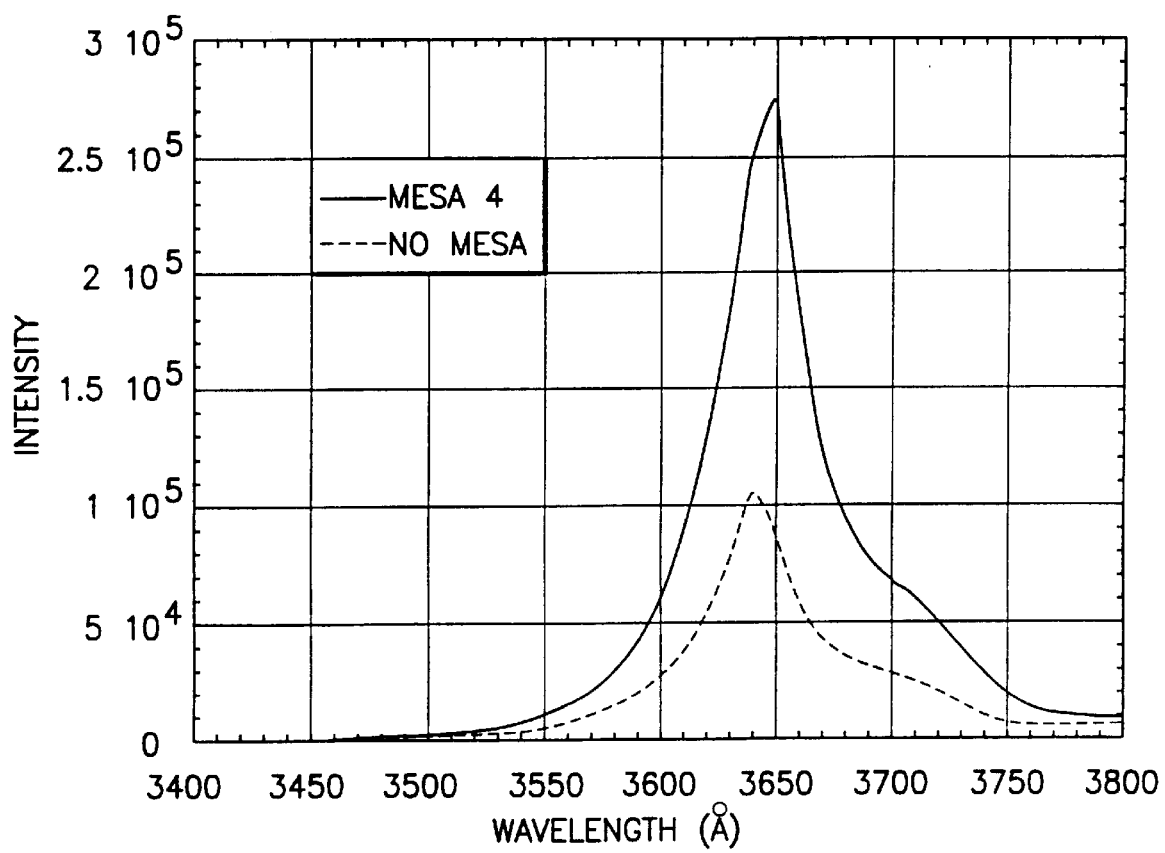
FIG. 17 is a plot of intensity, in arbitrary units, as a function of wavelength, for GaN band-edge PL intensity from material grown on top of the mesas (–) and on off-mesa regions ( . . . ) of an SiC substrate.
Figure 18:
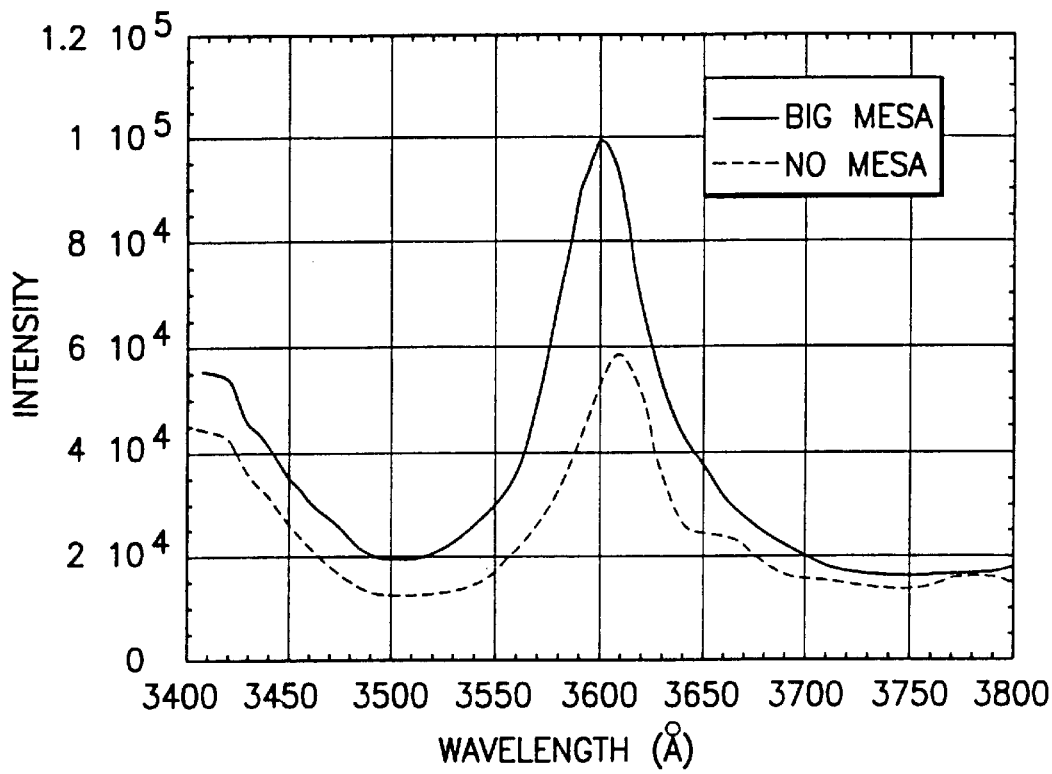
FIG. 18 is a plot of intensity, in arbitrary units, as a function of wavelength, for a 750 Å GaN quantum well structure grown on top of the mesas (–) and on off-mesa regions ( . . . ) of an SiC substrate.

The GaN band-edge PL intensity from material grown on top of the mesas was about a factor of two greater than from off-mesa regions of the 3 µm thick GaN layer and the 750 Å GaN well sample, as shown in FIGS. 17 and 18, respectively. The GaN band-edge peak is located at 364 nm in the GaN layer (FIG. 17) but is shifted ~28 meV higher in energy to 361 nm for the 750 Å thick GaN well (FIG. 18). The 750 Å GaN well is too thick to attribute the shift to quantum confinement effects. The shift in energy is likely due instead to strain resulting from the 0.4% lattice mismatch between the GaN and $Al_{0.15}Ga_{0.85}N$ layers.

Figure 19:
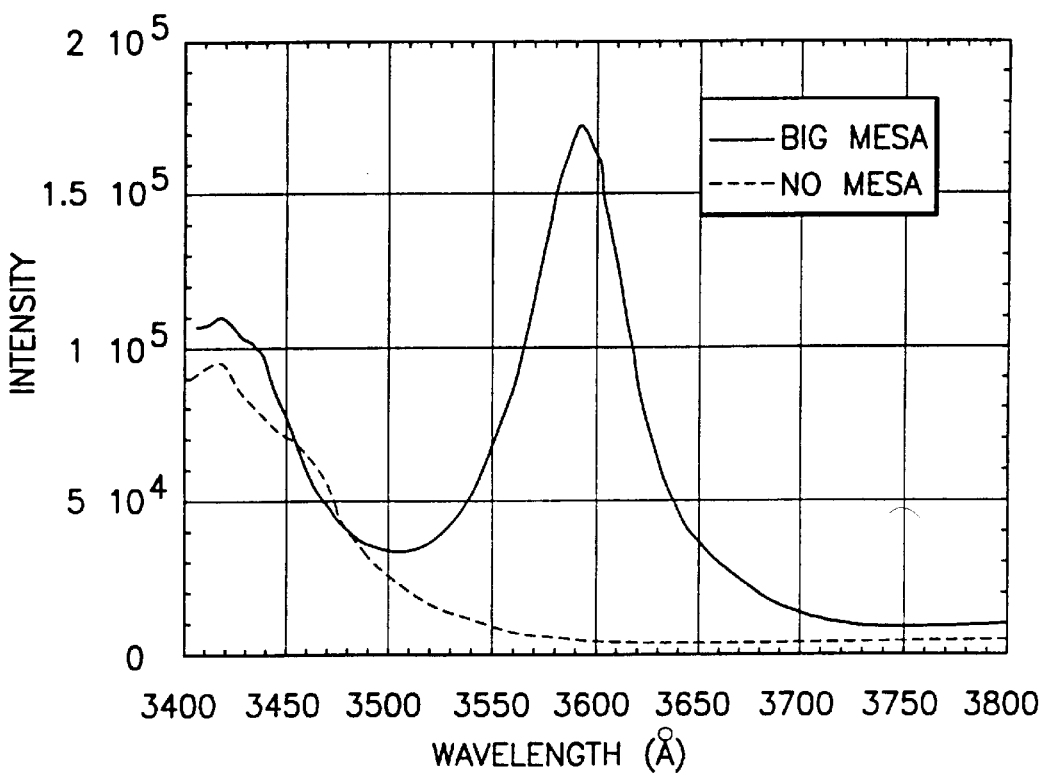
FIG. 19 is a plot of intensity, in arbitrary units, as a function of wavelength, for a 150 Å GaN quantum well structure grown on top of the mesas (–) and on off-mesa regions ( . . . ) of an SiC substrate.

The effect of the reduced area mesa was most pronounced for the 150 Å GaN quantum well sample. As shown in FIG. 19, GaN band-edge PL was only observed from material grown directly on top of the mesas. The GaN band-edge peak from the 150 Å GaN quantum well is at 359 nm, shifted ~47 meV higher in energy than for the thick GaN layer. The PL intensity near 340 nm in FIGS. 18 and 19 is from the AlGaN cladding layers.

The increased PL intensity from GaN and AlGaN/GaN quantum wells is likely due to an improvement in the structural properties of the material grown on the reduced area mesas. The surface morphology of the mesas was, in general, less rough than that of the surrounding regions, consistent with a decrease in the defect density of the material. The smoother surface may in part be responsible for the increased intensity on the mesas.

EXAMPLE IV

Attempts were made to grow GaN on the following buffers grown at high temperature: 1000 Å AlN, 1000 Å AlGaN and 1000 Å AlN/1000 Å $Al_{0.10}Ga_{0.90}N$/1000 Å AlN. All of these gave good x-ray diffraction (XRD) FWHM values in the 200 arcsec range, but the GaN epi-layers were cracked.

EXAMPLE V

A buffer structure which was determined to eliminate cracking of the GaN epi-layers comprises a compositionally graded (Al,Ga)N buffer wherein the Al content is graded from AlN at the substrate to GaN at the top. The growth rate of AlN is much lower than that of GaN for a given metalorganic (MO) mole fraction.

Figure 20:
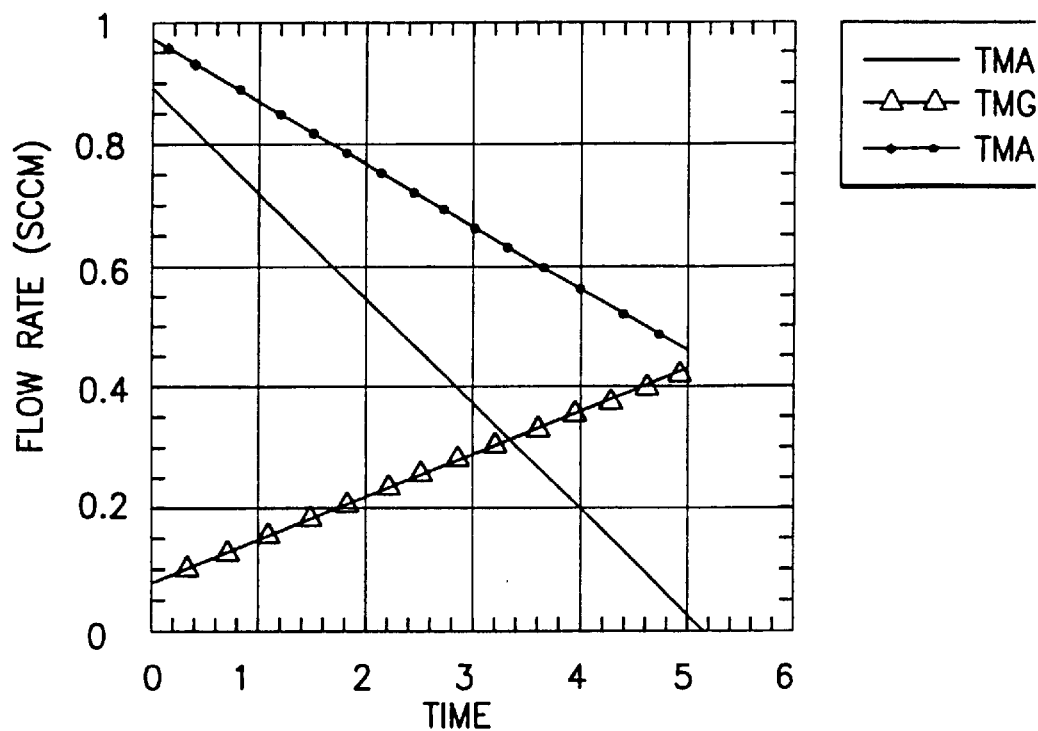
FIG. 20 is a graph of flow rate as a function of time, showing the variation of TMAl, TMGa flows during growth of a buffer.

The initial intent of the work in this example was to try and keep the growth rate constant throughout the buffer layer, and thus an initial TMAl flow rate and a final TMGa flow rate were chosen that would give the same growth rate and then would permit grading the flows to zero. This is shown in FIG. 20 wherein the flow rates are plotted as a function of time to show the variation of TMAl and TMGa flows during growth of a buffer.. The total MO flow rate (TMAl+TMGa) decreased during the growth of the buffer. The growth rate and composition gradient of the buffer is not known. The growth period was chosen to yield a thickness of ~1000–2000 Å, based on the initial AlN and final GaN growth rates. Cracking of the GaN film was inhibited.

GaN growth on the graded (Al,Ga)N buffer was repeated four times. In all instances, all of the GaN layers were free of cracks. The XRD FWHM of the GaN peak varied depending of the FWHM of the SiC substrate peak, as shown in Table IV below. The room temperature PL peak width did not significantly change.

TABLE IV

| Run No. | GaN XRD FWHM | SiC XRD FWHM | PL peak width |
| --- | --- | --- | --- |
| A | 110 arcsec | 42 arcsec | 38Å |
| B | 147 | 129 | 38Å |
| C | 281 | 208 | 38Å |
| D | 181 | 135 | 36Å |

EXAMPLE VI

Figure 21:
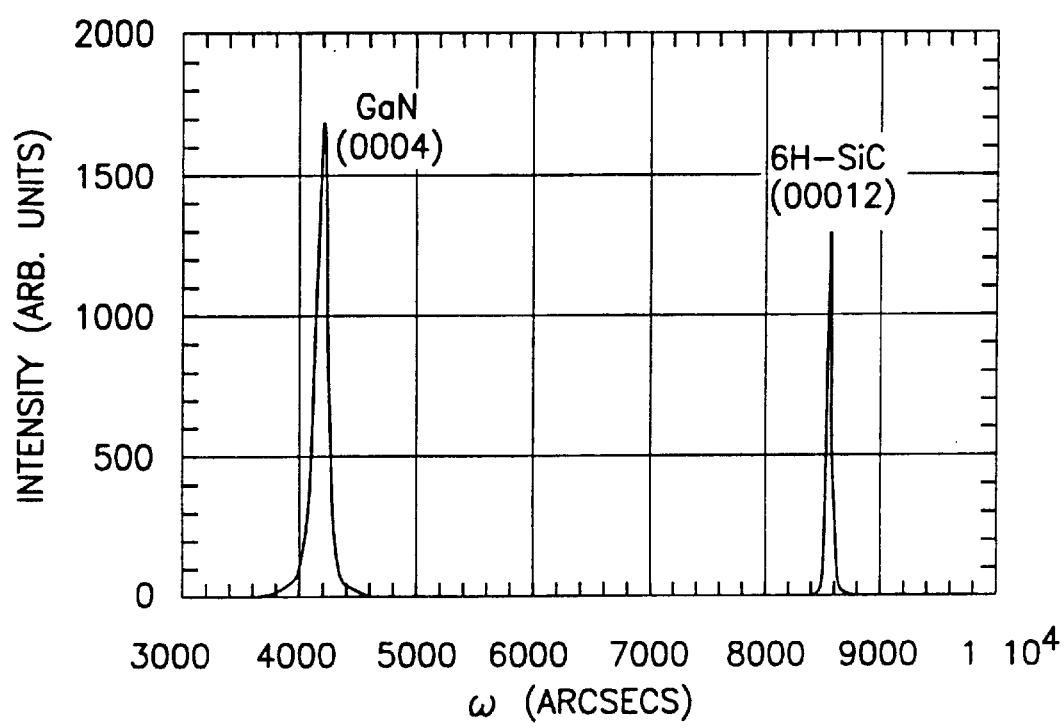
FIG. 21 is a graph of intensity, in arbitrary units, showing a double crystal x-ray rocking curve of a GaN layer grown on a compositionally graded (Al, Ga)N buffer on 6H-SiC.

A GaN layer was grown on a compositionally graded (Al, Ga)N buffer on 6H-SiC. A double crystal x-ray rocking curve of this sample was made, and is shown in FIG. 21. The full width at half-maximum (FWHM) of the GaN epi-layer is 110 arcsecs, indicating very good crystal quality. The SiC FWHM is 42 arcsecs. The room temperature photoluminescence of this sample contained a GaN band-edge peak at 363 nm with a peak of 36 nm with a peak width of 36 meV.

EXAMPLE VII

Reflectivity Measurements of III-V Nitride Bragg Reflector Stacks

Figure 22:
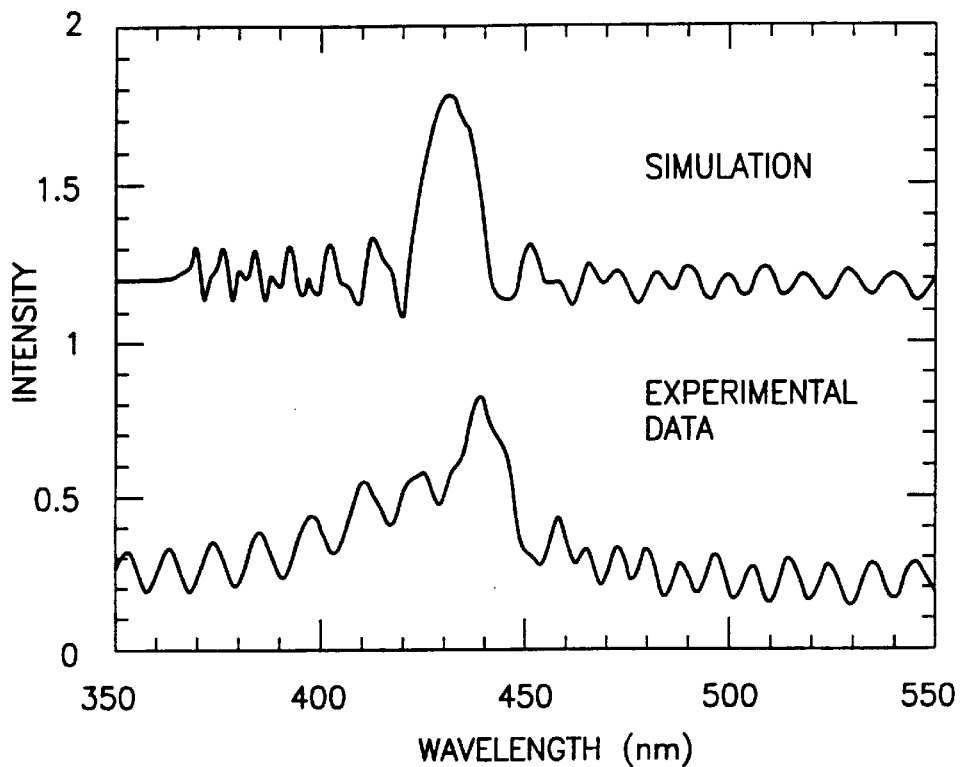
FIG. 22 is a graph of simulated and experimentally measured reflectivity from a 24 period 42.8 nm GaN/44.6 nm $Al_{0.15}Ga_{0.85}N$ reflector stack.

GaN/$Al_{0.15}Ga_{0.85}N$ and $Al_{0.12}Ga_{0.88}N/Al_{0.40}Ga_{0.60}N$ Bragg reflector stacks were fabricated on both SiC and sapphire substrates. FIG. 22 compares the simulated and experimentally measured reflectivity from a 24 repeat period 42.8 nm GaN/44.6 nm $Al_{0.15}Ga_{0.85}N$ Bragg reflector. The predicted reflectivity is 80% at 430 nm compared to the experimentally measured reflectivity of 80% at 438 nm.

EXAMPLE VII

Photolumninescence Measurements of Bragg Reflectors

Figure 23:
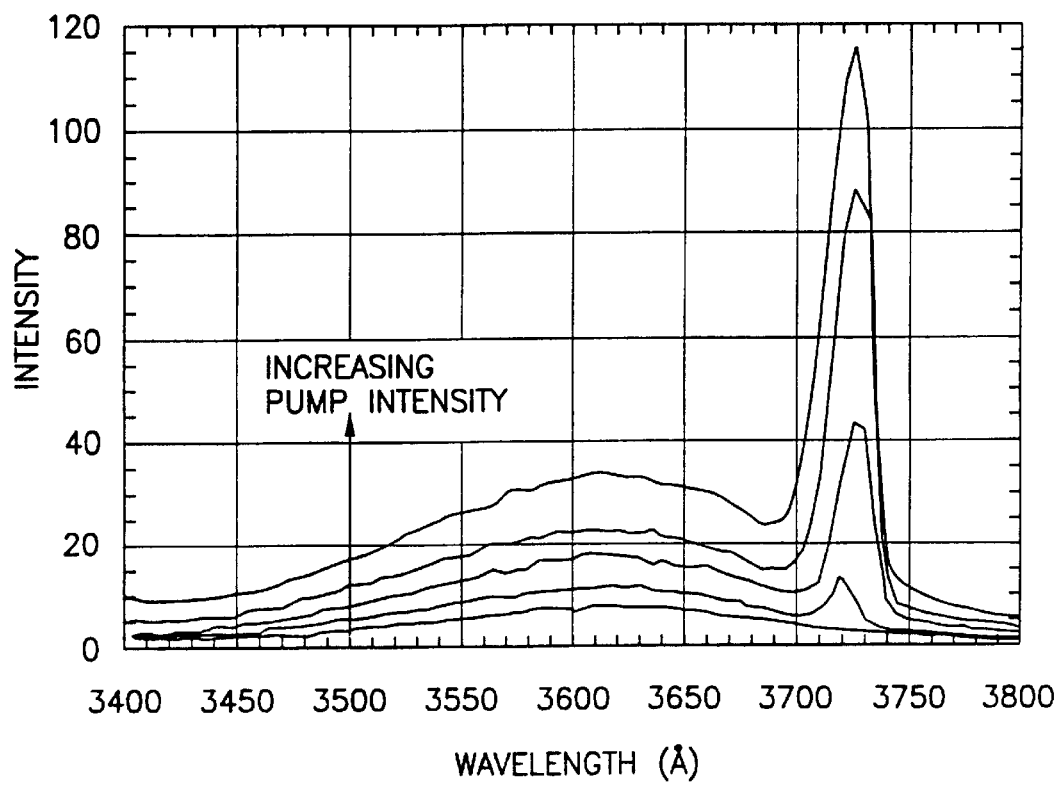
FIG. 23 is a graph of PL spectra as a function of input pump power for a GaN/AlGaN Bragg reflector stack grown on a SiC substrate.
Figure 24:
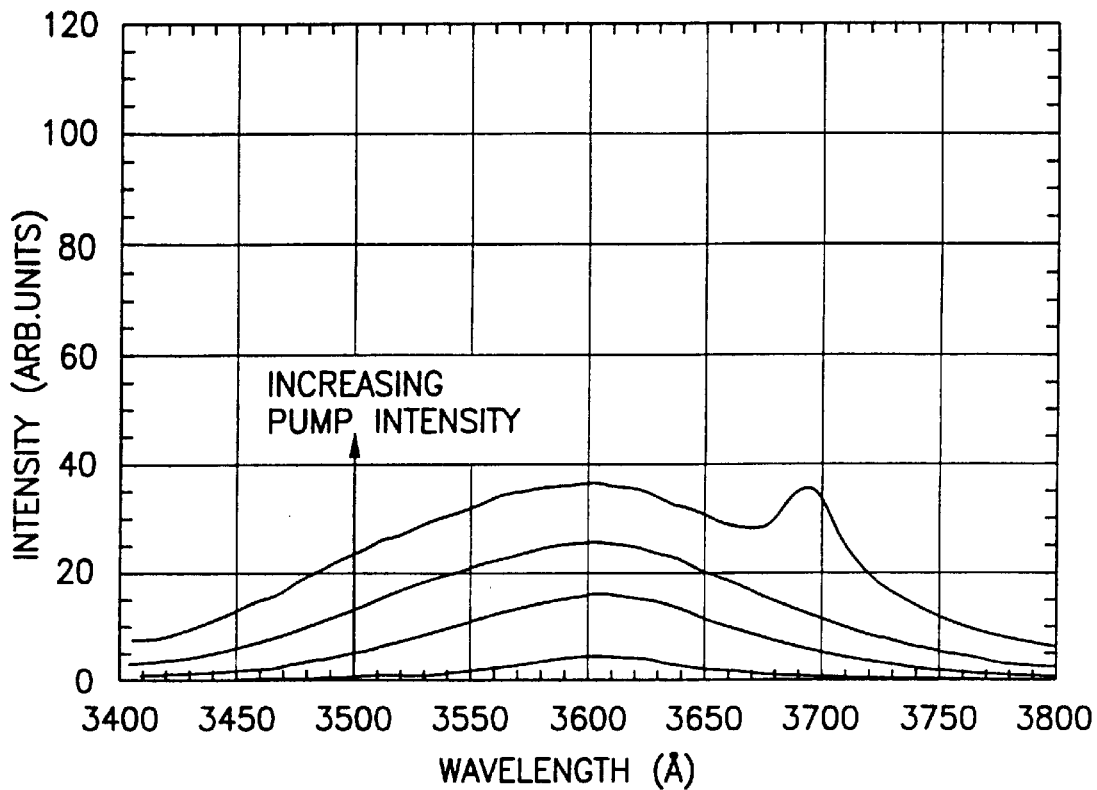
FIG. 24 is a graph of PL spectra as a function of input pump power for a GaN/AlGaN Bragg reflector stack grown on a sapphire substrate.

Photoluminescence measurements were used to study and compare the optical properties of Bragg reflector stacks grown on SiC and sapphire substrates. The spectra were obtained at room temperature using focused light from a pulsed nitrogen laser emitting at 337.1 nm. PL spectra of the Bragg reflectors grown on SiC and sapphire substrates are shown in FIGS. 23 and 24, respectively. FIG. 23 is a graph of PL spectra as a function of input pump power for a GaN/AlGaN Bragg reflector stack grown on a SiC substrate. FIG. 24 is graph of PL spectra as a function of input pump power for a GaN/AlGaN Bragg reflector stack grown on a sapphire substrate.

Spectra obtained from the Bragg reflector grown on SiC for low powers exhibit a single feature peaked at 363 nm. At higher powers, a sharp peak, corresponding to stimulated emission, at 372 nm emerges from the broader band-edge peak and increases rapidly with pump intensity. The peak intensity at 372 nm clearly exhibits a threshold behavior with an approximate threshold pump density of 70 MW/$cm^2$. The threshold pump density for the onset of stimulated emission is much higher in the Bragg reflector stack grown on sapphire, as shown in FIG. 24. In this case. the threshold pump density is 200 MW/$cm^2$.

EXAMPLE VIII

VCSEL Structures utilizing Bragg Reflectors

Figure 25:
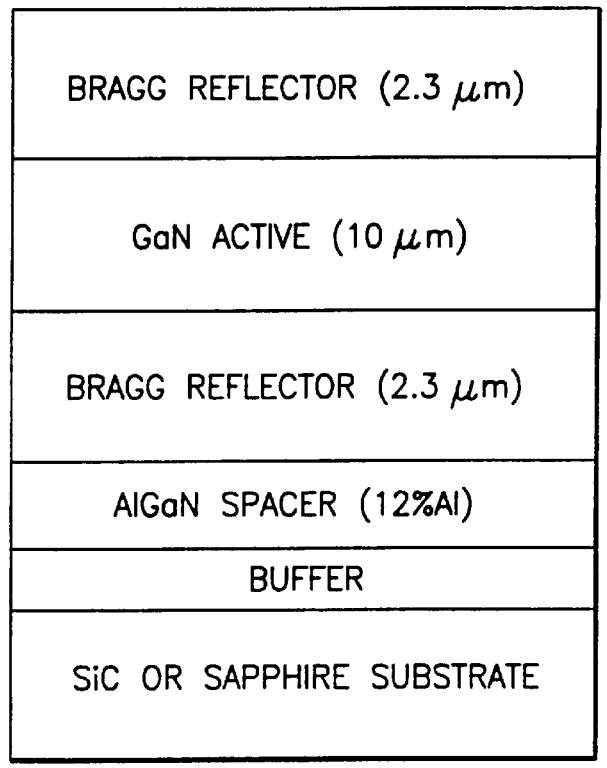
FIG. 25 is a schematic cross-section of VCSEL structures of a device in which the Bragg reflectors are 30-period $Al_{0.40}Ga_{0.60}N/Al_{0.12}Ga_{0.88}N$ (397 Å/372 Å) multilayer stacks.

III-V nitride Bragg reflectors were employed in the fabrication of vertical cavity surface emitting laser (VCSEL) structures. The VCSEL structure, shown schematically in FIG. 25, consisted of a 10 μm GaN active region within a vertical cavity formed by 30-period $Al_{0.40}Ga_{0.60}N$-$Al_{0.12}Ga_{0.88}N$ Bragg reflector (397 Å/372 Å) multilayer stacks. The Bragg reflectors were designed to have 99% reflectivity at 370 nm. The III-V nitride layers were grown by low pressure MOVPE in separate growth runs on a c-plane (0001) sapphire substrate and an (0001) 6H-SiC substrate miscut 4° toward the <11$\bar{2}$0>. Trimethylgallium, trimethylalurninurn, and ammonia were used as precursors with hydrogen as the carrier gas. Optimized buffers were initially grown on each type of substrate followed by the growth of an $Al_{0.12}Ga_{0.88}N$ layer and the VCSEL epilayers at 1100° C.

Optical pumping experiments were performed using a pulsed nitrogen laser as the pump source. The VCSELs were photopumped from the side, with the pump beam focused to a ~70 μm spot on an edge of the sample, and surface luminescence was collected by a lens system and focused into an 0.64 m monochromator with a UV grating. Peak intensities of the focused pump light were estimated from the spot size (70 μm), the pulse width, and the pulse energy. The pulse width is taken to be 0.8 ns, as given by the manufacturer specifications. Data were determined for pump intensities of 0.65–4.3 MW/$cm^2$, corresponding to measured pulse energies of 0.94–6.3 μJ/pulse.

Figure 26:
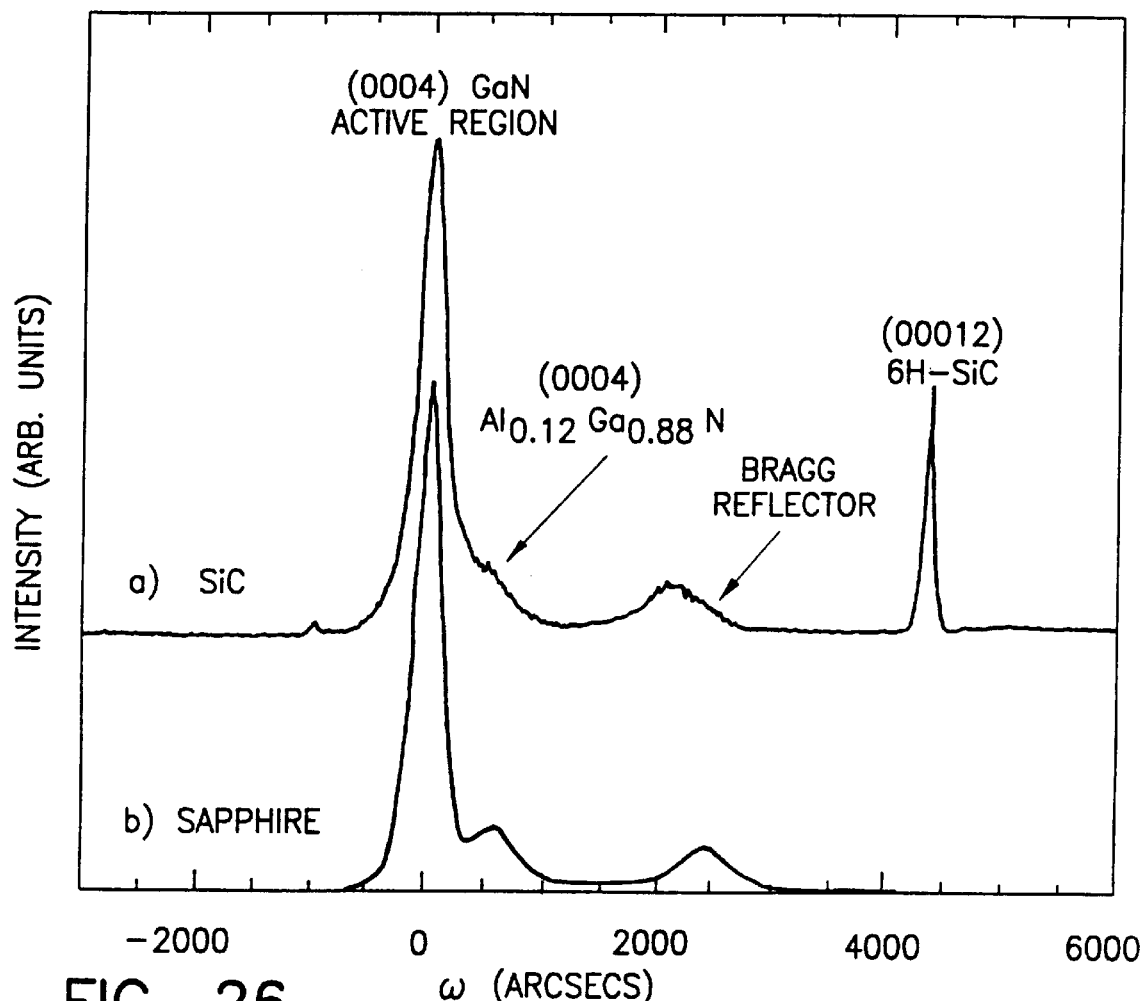
FIG. 26 is a double crystal x-ray rocking curves (w-scan) of VCSEL grown on (A) 6H-SiC and (B) sapphire substrates.

FIG. 26 shows double crystal x-ray rocking curves (w-scan) of VCSEL grown on a) 6H-SiC and b) sapphire substrates. The structural quality of the VCSEL layers was characterized using double crystal x-ray diffraction. The full-width-at-half maximum (FWHM) for the (0004) GaN reflection in FIG. 26, in curve (a) is 260 arcsecs, while the zero-order reflection from the top and bottom $Al_{0.40}Ga_{0.60}N$-$Al_{0.12}Ga_{0.88}N$ multilayer stacks had a FWHM of 580 arcsecs. It was not possible to clearly resolve higher-order multilayer reflections. likely due to the broadness of the zero-order peak. Similar peak positions and widths were measured for the VCSEL grown on sapphire, as shown in curve (b) in FIG. 26.

Surface emission spectra obtained at three different pump intensities are shown in FIG. 6 for the VCSEL grown on sapphire. At a pump intensity of 1.3 MW/$cm^2$ (~0.65 $P_{th}$), the spectrum consists of a single PL peak centered at 368 nm. At an input intensity of 2.2 MW/$cm^2$ (1.1 $P_{th}$), the emergence of a sharp feature peaked near 363.5 nm is evident. The intensity of this peak becomes dominant at higher powers and is accompanied by the emergence of additional peaks at 362.1 nm and 364.8 nm, which are equally separated from the dominant mode by ~1.3 nm. Peak and integrated intensities of the emission spectra are plotted in FIG. 7 as a function of pump intensity. The peak intensity increases slowly with pump intensity up to ~2 MW/$cm^2$, above which the intensity increases much more rapidly as the sharp 363.5 nm line emerges and dominates the spontaneous emission peak. Estimation of lasing threshold from extrapolation of both the peak and integrated intensity data yields $P_{th}$~2.0 MW/cm$^2$.

The observed mode spacing of ~1.3 nm is consistent with expectations for the VCSEL structure. The structure was modeled using a transfer matrix approach which allows for dispersion and loss in the layer materials. Wavelength-dependent refractive indices for the various layers were obtained from parameter interpolation and an empirical model which closely fits near-gap ellipsometry data for GaN and $Al_{0.1}Ga_{0.90}N$. The model predicts a mode spacing of 1.1 nm for the VCSEL and a peak reflectivity near the design wavelength of 370 nm for the Bragg reflectors.

Figure 27:
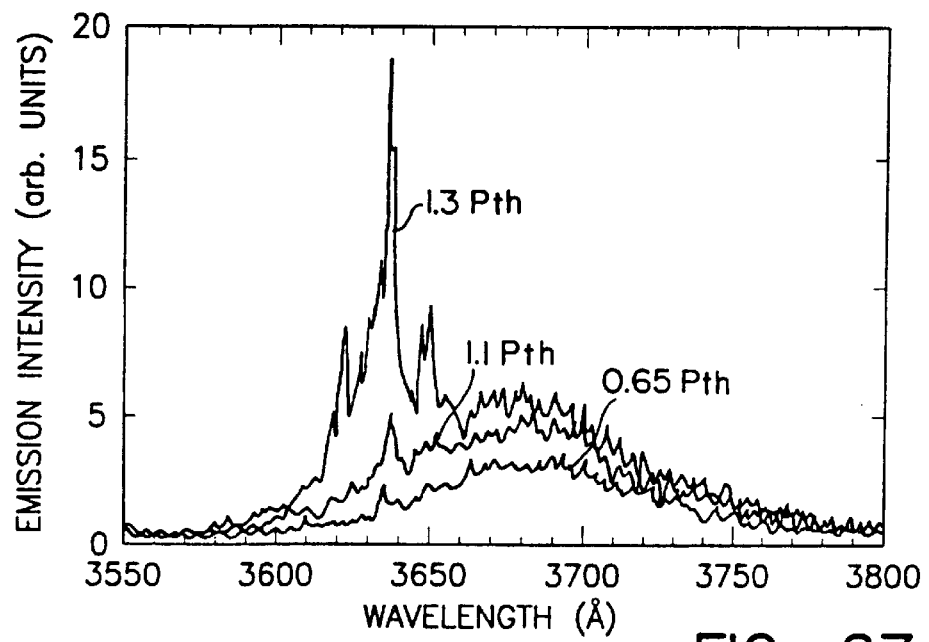
FIG. 27 is a graph of room temperature surface emission spectra for VCSEL grown on sapphire at increasing pump intensities.
Figure 28:
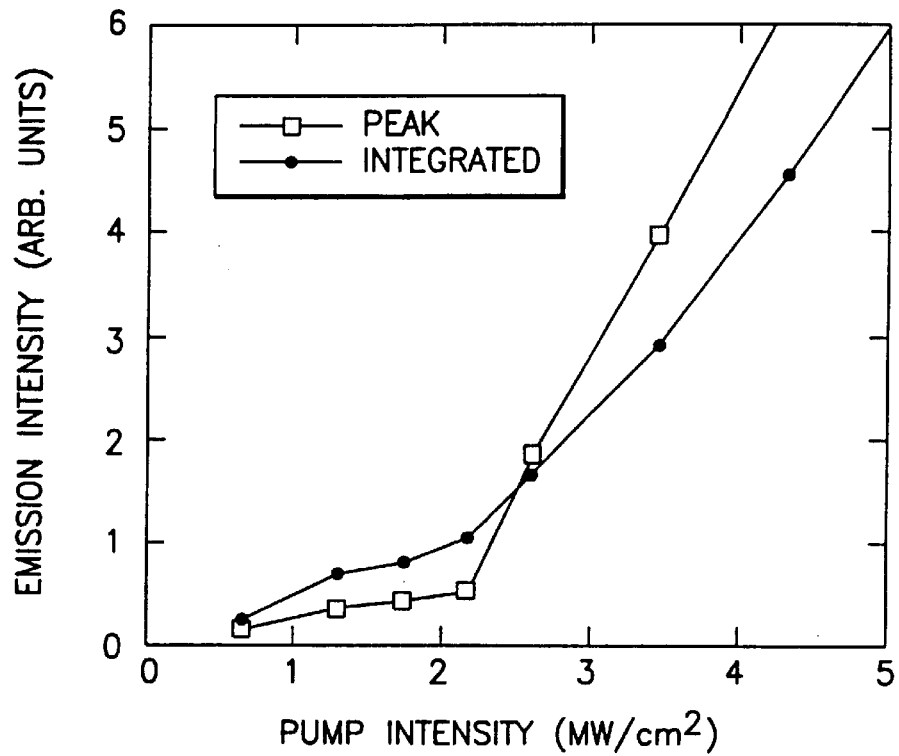
FIG. 28 is a graph of peak and integrated intensities of the VCSEL/sapphire emission spectrum as a function of pump intensity in which the extrapolated threshold pump intensity is 2.0 M W/cm$^2$.

FIG. 27 is a graph of room temperature surface emission spectra for VCSEL grown on sapphire at increasing pump intensities. FIG. 28 is a graph of peak and integrated intensities of the VCSEL/sapphire emission spectrum as a function of pump intensity. The threshold pump intensity, extrapolated from data on peak emission intensities, is 2.0 MW/cm$^2$.

Figure 29:
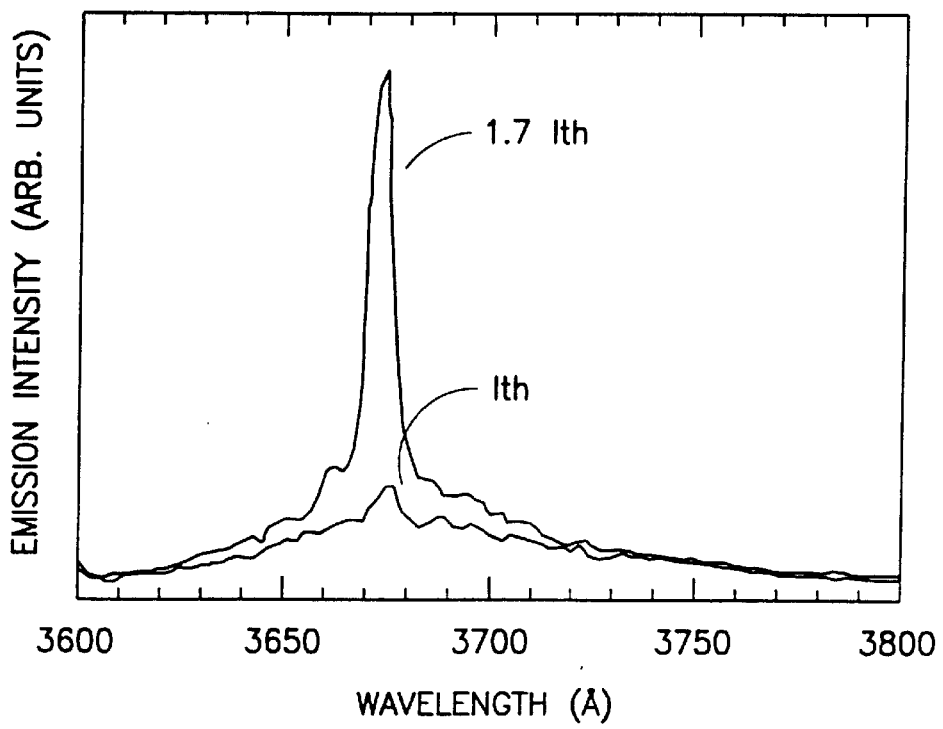
FIG. 29 is a graph of room temperature surface emission spectra for VCSEL grown on SiC at increasing pump intensities.

FIG. 29 is a graph of the spectral characteristics of surface emission from the VCSEL grown on SiC both at ($P_{th}$) and above the threshold (1.7 $P_{th}$), showing the room temperature emission spectra for VCSEL grown on SiC at increasing pump intensities. In this case, a single narrow (0.2 nm) emission peak at 367.5 nm was observed, in contrast to the multi-mode spectrum obtained from the VCSEL grown on sapphire. The intensity of the 367.5 nm peak increases rapidly with pump power above a threshold value of ~3 MW/cm$^2$. While several areas along the length of each sample were photopumped, single mode lasing was only observed from the VCSEL grown on the SiC substrate. The emission from the VCSEL grown on SiC is at a higher wavelength (367.5 nm) than the VCSEL grown on sapphire (363.5 nm), consistent with the shift in GaN near band-edge spontaneous emission that we have previously observed for GaN grown on the two types of substrates.

PREFERRED MODES OF CARRYING OUT THE INVENTION

The invention is advantageously carried out in LED, laser and other device applications with SiC substrates providing high charge carrier mobility, to maximize device performance.

Accordingly, 4H-SiC or 2H-SiC may be employed as polytypes for the SiC substrate due to their high intrinsic mobility characteristics. Alternatively, where the SiC substrate has a more anisotropic character and a lower intrinsic charge carrier mobility, such as is the case with the 6H-SiC polytype, the substrate is desirably deployed with the substrate crystal's highest mobility axis (a-axis in the case of 6H-SiC) being aligned with the current flow direction in the device.

In applications in which broad-spectrum transparency is desired for light emission, larger band gap materials such as 2H-SiC and 4H-SiC polytypes afford significant optical advantages. For high-energy transmission applications such as communications and spectroscopy, the 2H-SiC and 4H-SiC polytypes are highly desirable, in consequence of their large band gap and low cut-off wavelength characteristics.

Devices according to the invention having quantum well active regions may also fabricated in which the well width is selectively dimensioned and the well composition and barrier layer composition are selectively provided, to yield a specific emission wavelength and energy.

Devices fabricated in accordance with the invention may employ a dielectric Bragg mirror comprising a series of metallonitride material layers under the light emitting structure, to increase the light emission of the device. The inherent series resistances and charge carrrier potential barriers of Bragg mirror structures which degrade their optical and performance properties can be ameliorated by the provision of buffer layers (an intermediate composition, short period superlattices, or strained layer superlattices) between the successive main layers of the structure.

The fabrication of light-emitting optical devices in the practice of the invention may be advantageously conducted without having to carry out etching after dicing has been performed on the device structure, by the method of etching mesas on the SiC substrate prior to growth of Ga*N epilayers, with passivation of the mesa edge, prior to formation of contacts, so that the active region of the device is removed from the dicing region. Such spatial separation and isolation of the active area of the device, e.g., the p-n junction of a LED structure thus prevents the occurrence of dicing damage which may significantly degrade the light emission efficiency or service life of the device. The passivation layer may be formed of a material such as silicon dioxide or silicon nitride, deposited by CVD, sputtering, plasma-assisted deposition, or other suitable technique, at a thickness of for example 200 to 2000 Å.

A preferred fabrication technique usefully employed in the practice of the invention involves utilizing reduced area mesas for Ga*N device fabrication. By such technique, the interfacial dislocation density is significantly reduced, relative to other substrate base structures, as a result of the freedom of dislocations to move to edge regions of the small sized mesas. where dislocations are annihilated.

In consequence, the devices fabricated on such small sized mesas have substantially improved structural and optical properties, including increased intensity of emitted light, and smooth surface morphology of the mesa areas.

The preferred mesa structures may include mesas with a height of 1–15 $\mu$m and an equivalent diameter of the mesa top surface area in the range of from 25–300 $\mu$m, on a suitable SiC substrate, such a for example (0001) 6H-SiC with a misorientation 4° towards <11$\bar{2}$0>. The specific process of mesa formation may illustratively comprise the steps of (1) lithography to define mesas, (2) evaporation and lift-off of Ni to define circular mask areas for etching, (3) reactive ion etching of SiC to define mesas, and (4) removal of Ni and cleaning of SiC substrate.

Epi-layer crack-resistant Ga*N structures such as Ga*N/SiC semiconductor devices or precursors thereof, may be fabricated in which the buffer layers are employed to provide the overall structure with a good lattice match and a good coefficient of thermal expansion match silicon carbide and gallium nitride layers. Such buffer layer advantageously-comprises a compositionally graded Ga*N layer, such as a compositionally graded $Al_xGa_{1-x}N$ buffer layer between the gallium nitride and silicon carbide layers, wherein x can range from 0 to 1, and wherein the buffer layer is compositionall, and preferably smoothly, graded from an interface of the the buffer layer with the silicon carbide layer at which x is 0, to an interface of the buffer layer with the gallium nitride layer at which x is 1. The thickness of such graded buffer layer ranges from 200 Å up to 5 $\mu$m, preferably from 500 Å up to 1 $\mu$m.

Alternatively, the semiconductor device or precursor structure may comprise a thin AlN buffer layer which is initially grown on SiC followed by the compositionally graded (Al, Ga)N buffer and the GaN epitaxial layer, wherein the thickness of such AlN buffer layer ranges from 50 Å up to 5 μm, preferably from 100 Å up to 1 μm.

The semiconductor device or precursor structure may alternatively comprise a conductive buffer layer of the formula $Al_xGa_{1-x}N$ including a lower Al composition layer that is doped with suitable dopant species (e.g., Si, Mg) to render it highly conductive in character, such that x is in the range of from x=1 to x=0.3, preferably between 0.7 to 0.4. The corresponding end composition could be GaN or a lower $Al_yGa_{1-y}N$ composition, wherein y<x, and the use of the composition $Al_yGa_{1-y}N$ instead of GaN as the final composition in the graded buffer layer may be particularly useful when the epitaxial layer to be grown on the buffer is (Al, Ga)N instead of GaN.

INDUSTRIAL APPLICABILITY

The light emitting optical devices of the present invention have utility in industrial devices such as lasers and LEDs, for applications such as high density optical storage, full color displays, color determination systems, and spectroscopic analysis sources. In such applications, the electroluminescent devices of the invention efficiently emit very bright light, as measured by the indicia of quantum efficiency and luminous intensity.

We claim:

1. A semiconductor device or precursor thereof, comprising a layer of single crystal silicon carbide and a layer of single crystal gallium nitride, having a buffer layer therebetween comprising a compositionally graded Ga*N layer.

2. A semiconductor device or precursor thereof according to claim 1, wherein the silicon carbide comprises a polytype selected from the group consisting of 2H-SiC, 4H-SiC, and 6H-SiC.

3. A semiconductor device or precursor thereof according to claim 1, wherein said compositionally graded Ga*N layer comprise a compositionally graded $Al_xGa_{1-x}N$ buffer layer between the gallium nitride and silicon carbide layers, wherein x can range from 0 to 1, and the buffer layer is compositionally graded from an interface of the the buffer layer with the silicon carbide layer at which x is 0, to an interface of the buffer layer with the gallium nitride layer at which x is 1.

4. A semiconductor device or precursor thereof, comprising a silicon carbide substrate and an epitaxial layer of gallium nitride, having a buffer layer therebetween comprising a compositionally graded (Al,Ga)N buffer layer.

5. A semiconductor device or precursor thereof according to claim 4, wherein said buffer layer comprises an AlGa1-,N buffer layer where the Al composition (x) is graded from 1 at the buffer-SiC interface to 0 at the GaN-buffer interface.

6. A semiconductor device or precursor thereof according to claim 4, wherein the thickness of said buffer layer is from 200 Å to 5 μm.

7. A semiconductor device or precursor thereof according to claim 4, wherein the thickness of said buffer layer is from 500 Å to 1 μm.

8. A semiconductor device or precursor thereof, comprising a silicon carbide substrate and an epitaxial layer of gallium nitride, having a buffer material therebetween comprising an AlN buffer layer on the silicon carbide substrate, and a compositionally graded (Al,Ga)N buffer layer between the AlN buffer layer and the gallium nitride epitaxial layer.

9. A semiconductor device or precursor thereof according to claim 8, wherein the thickness of said AlN buffer layer is from 50 Å to 5 μm.

10. A semiconductor device or precursor thereof according to claim 8, wherein the thickness of said AlN buffer layer is from 100 Å to 1 μm.

11. A semiconductor device or precursor thereof, comprising a silicon carbide substrate and an epitaxial layer of gallium nitride, having a buffer material therebetween comprising a conductive buffer layer of the formula $Al_xGa_{1-x}N$ wherein the buffer layer includes a lower Al composition layer that is doped to render it highly conductive in character.

12. A semiconductor device or precursor thereof according to claim 11, wherein x is in the range of from x=1 to x=0.3.

13. A semiconductor device or precursor thereof according to claim 11, wherein x is in the range of from x=0.7 to x=0.4.

14. A semiconductor device or precursor thereof according to claim 11, wherein the buffer material comprises an end composition adjacent said gallium nitride epitaxial layer, selected from the group consisting of GaN and a lower $Al_yGa_{1-y}N$ composition, where y<x.

15. A semiconductor device or precursor thereof according to claim 14, wherein the buffer material comprises a s said end composition $Al_yGa_{1-y}N$ and the gallium nitride epitaxial layer comprises (Al, Ga)N.

16. A semiconductor device or precursor thereof according to claim 11, wherein the conductive buffer layer is an n-type material.

17. A semiconductor device or precursor thereof according to claim 11, wherein the conductive buffer layer is a p-type material.

18. A semiconductor device or precursor thereof, comprising a silicon carbide substrate and an epitaxial layer of gallium nitride, having a buffer material therebetween comprising a buffer layer selected from the group consisting of (Al, Ga)N compositionally graded layers, (Al, In)N compositionally graded layers, and (Al, Ga, In)N compositionally graded layers.

19. A semiconductor device or precursor thereof according to claim 18, wherein the epitaxial layer of gallium nitride contains In.

20. A semiconductor device or precursor thereof according to claim 19, wherein the epitaxial layer of gallium nitride comprises an epitaxial layer formed of material selected from the group consisting of (In, Ga)N, (In, Ga)N, and (Al, Ga, In)N.

21. A semiconductor device or precursor thereof according to claim 19, wherein the epitaxial layer of gallium nitride comprises $In_{0.1}Ga_{0.9}N$, and the buffer material includes AlN grading through (Al, Ga)N to GaN, and grading from GaN to $In_{0.1}Ga_{0.9}N$.

22. A semiconductor device or precursor thereof, comprising a SiC substrate element including a mesa-shaped portion having a Ga*N quantum well structure or other Ga*N s tructure formed thereon, where in t he mesa-shaped portion has an equivalent diameter in the range of from 50 to 300 μm, and a height of from 1 to 15 μm.

23. A semiconductor device or precursor thereof according to claim 22, wherein the SiC substrate comprise an SiC polytype selected from the group consisting of 2H-SiC, 4H-SiC, and a-axis oriented 6H-SiC.

24. A semiconductor device or precursor thereof according to claim 22, wherein said mesa-shaped portion has a quantum well structure thereon, and said quantum well structure includes a well having a well width of from 150 Å to 750 Å.

25. A method for fabricating a light emitting diode comprising the steps of:

a. forming an $M_xM'_yM''_{1-x-y}N$ barrier layer on a conductive substrate, wherein M, M', and M'' are metals compatible with nitrogen (N) in the composition $M_xM'_yM''_{1-x-y}N$, and the composition $M_xM'_yM''_{1-x-y}N$ is stable at room temperatures and pressures;

b. forming an $M_aM'_bM''_{1-a-b}N$ active region on the $M_xM'_yM''_{1-x-y}N$ barrier layer;

c. forming an $M_cM'_dM''_{1-c-d}N$ barrier layer on the $M_aM'_bM''_{1-a-b}N$ active region;

d. forming a heavily doped contact layer on the $M_cM'_dM''_{1-c-d}N$ barrier layer; and e. forming a first contact on the heavily doped contact layer and a second contact on the substrate, wherein x, y, a, b, c, and d are numbers, each number having a magnitude between zero and one and wherein x+y, a+b, and c+d, each have a magnitude between zero and one.

26. The method of claim 25 wherein the substrate is a selected polytype of silicon carbide (SiC) selected from a group of polytypes of SiC including 2H-SiC, 4H-SiC, and a-axis oriented 6H-SiC.

27. The method of claim 26 wherein the SiC substrate is oriented to have a high mobility axis aligned with the direction of electron current.

28. A method for fabricating a light emitting diode comprising the steps of:

a. forming a first barrier layer on a conductive substrate, the first barrier layer being a first selected composition;

b. forming an active region of a second selected composition on the first barrier layer;

C. forming a second barrier layer of a third selected composition on the active region;

d. forming a heavily doped contact layer of a fourth selected composition on the second barrier layer; and e. forming a first contact on the heavily doped contact layer and a second contact on the substrate, wherein the first, second, third and fourth selected compositions are selected from a group of compositions $M_xM'_yM''_{1-x-y}N$, $M_aM'_bM''_{1-a-b}N$, $M_cM'_dM''_{1-c-d}N$ and $M_eM'_fM''_{1-e-f}N$, respectively, wherein x, y, a, b, c, d, e, and f are numbers, each number having a magnitude between zero and one and wherein x+y, a+b, c+d, and e+f, each has a magnitude between zero and one.

29. The method of claim 28 wherein the substrate is a selected polytype of silicon carbide (SC) selected from a group of polytypes of SC including 2H-SiC, 4H-SiC, and a-axis oriented 6H-SiC.

30. The method for fabricating a light emitting diode with a Bragg mirror, the method comprising the steps of:

a. forming a Bragg mirror including alternating layers of AlN, GaN, InN, or their alloys on a conductive substrate;

b. forming an $M_xM'_yM''_{1-x-y}N$ barrier layer on a conductive substrate, wherein M, M', and M'' are metals compatible with nitrogen (N) in the composition $M_xM'_yM''_{1-x-y}N$, and the composition $M_xM'_yM''_{1-x-y}N$ is stable at room temperatures and pressures;

c. forming an $M_aM'_bM''_{1-a-b}N$ active region on the $M_xM'_yM''_{1-x-y}N$ barrier layer;

d. forming an $M_cM'_dM''_{1-c-d}N$ barrier layer on the $M_aM'_bM''_{1-a-b}N$ active region;

e. forming a heavily doped contact layer on the $M_cM'_dM''_{1-c-d}N$ barrier layer; and f. forming a first contact on the heavily doped contact layer and a second contact on the substrate, wherein x, y, a, b, c, and d are numbers, each number having a magnitude between zero and one and wherein x+y, a+b, and c+d, each have a magnitude between zero and one.

31. The method of claim 30 wherein the substrate is a selected polytype of silicon carbide (SiC), selected from a group of polytypes of SiC including 2H-SiC, 4H-SiC, and a-axis oriented 6H-SiC.

32. The method for fabricating light emitting diodes (LEDs) comprising the steps of:

a. forming a first barrier layer on a conductive substrate;

b. forming an active region on the first barrier layer;

C. forming a second barrier layer on the active region;

d. forming a heavily doped contact layer on the second barrier layer;

e. masking each LED device area;

f. mesa etching trenches between the LED device areas and leaving the LEDs as mesas separated by the trenches;

g. passivating sidewalls of the LEDs;

h. forming a first contact on the heavily doped contact layer and a second contact on the substrate; and i. slicing the substrate only in the trenches.

* * * * *